United States Patent
Basker et al.

(10) Patent No.: US 9,960,168 B2
(45) Date of Patent: May 1, 2018

(54) CAPACITOR STRAP CONNECTION STRUCTURE AND FABRICATION METHOD

(71) Applicant: GLOBALFOUNDRIES Inc., Grand Cayman (KY)

(72) Inventors: Veeraraghavan S. Basker, Schenectady, NY (US); Kangguo Cheng, Schenectady, NY (US); Benjamin Ryan Cipriany, Wappingers Falls, NY (US); Ramachandra Divakaruni, Ossining, NY (US); Brian J. Greene, Wappingers Falls, NY (US); Ali Khakifirooz, Los Altos, CA (US); Byeong Yeol Kim, Lagrangeville, NY (US); William Larsen Nicoll, Hopewell Junction, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 120 days.

(21) Appl. No.: 14/582,655

(22) Filed: Dec. 24, 2014

(65) Prior Publication Data

US 2016/0190140 A1 Jun. 30, 2016

(51) Int. Cl.
| | | |
|---|---|---|
| *H01L 21/20* | (2006.01) | |
| *H01L 27/108* | (2006.01) | |
| *H01L 21/324* | (2006.01) | |
| *H01L 21/84* | (2006.01) | |
| *H01L 29/94* | (2006.01) | |
| *H01L 27/12* | (2006.01) | |
| *H01L 21/02* | (2006.01) | |
| *H01L 21/285* | (2006.01) | |
| *H01L 21/768* | (2006.01) | |

(52) U.S. Cl.
CPC ...... *H01L 27/10829* (2013.01); *H01L 21/324* (2013.01); *H01L 21/845* (2013.01); *H01L 27/10867* (2013.01); *H01L 27/1211* (2013.01); *H01L 29/945* (2013.01); *H01L 21/02532* (2013.01); *H01L 21/02576* (2013.01); *H01L 21/28518* (2013.01); *H01L 21/76895* (2013.01); *H01L 27/10826* (2013.01); *H01L 27/10879* (2013.01)

(58) Field of Classification Search
CPC ... H01L 21/84; H01L 27/1087; H01L 29/945; H01L 29/66181; H01L 29/94; H01L 21/20; H01L 21/823807; H01L 27/0629; H01L 27/10829; H01L 27/10894; H01L 27/10897; H01L 27/1203; H01L 21/82
USPC ............... 438/242–248, 386; 257/301–305, 257/E21.008, E21.09, E29.345
See application file for complete search history.

(56) References Cited

U.S. PATENT DOCUMENTS

| | | |
|---|---|---|
| 6,452,224 B1 | 9/2002 | Mandelman et al. |
| 6,534,814 B2 | 3/2003 | Iba et al. |
| 6,872,619 B2 | 3/2005 | Chen et al. |

(Continued)

*Primary Examiner* — Charles Garber
*Assistant Examiner* — Abdulfattah Mustapha
(74) *Attorney, Agent, or Firm* — Heslin Rothenberg Farley & Mesiti P.C.

(57) ABSTRACT

Structures and methods for deep trench capacitor connections are disclosed. The structure includes a reduced diameter top portion of the capacitor conductor. This increases the effective spacing between neighboring deep trench capacitors. Silicide or additional polysilicon are then deposited to complete the connection between the deep trench capacitor and a neighboring transistor.

20 Claims, 20 Drawing Sheets

(56) References Cited

U.S. PATENT DOCUMENTS

| | | |
|---|---|---|
| 6,951,822 B2 | 10/2005 | Scholz |
| 7,122,437 B2 | 10/2006 | Dyer et al. |
| 7,682,897 B2 | 3/2010 | Wu et al. |
| 7,713,814 B2 | 5/2010 | Cheng et al. |
| 7,791,124 B2 | 9/2010 | Cheng et al. |
| 2005/0133846 A1* | 6/2005 | Dyer ................ H01L 29/945 257/303 |
| 2008/0001196 A1* | 1/2008 | Cheng ............ H01L 27/10829 257/296 |
| 2009/0236691 A1* | 9/2009 | Dyer .................. H01L 21/84 257/532 |
| 2009/0289291 A1* | 11/2009 | Cheng ............... H01L 21/84 257/301 |
| 2012/0248522 A1* | 10/2012 | Goyal ............ H01L 27/10832 257/301 |
| 2013/0069199 A1* | 3/2013 | Adkisson ............. H01L 28/90 257/532 |

\* cited by examiner

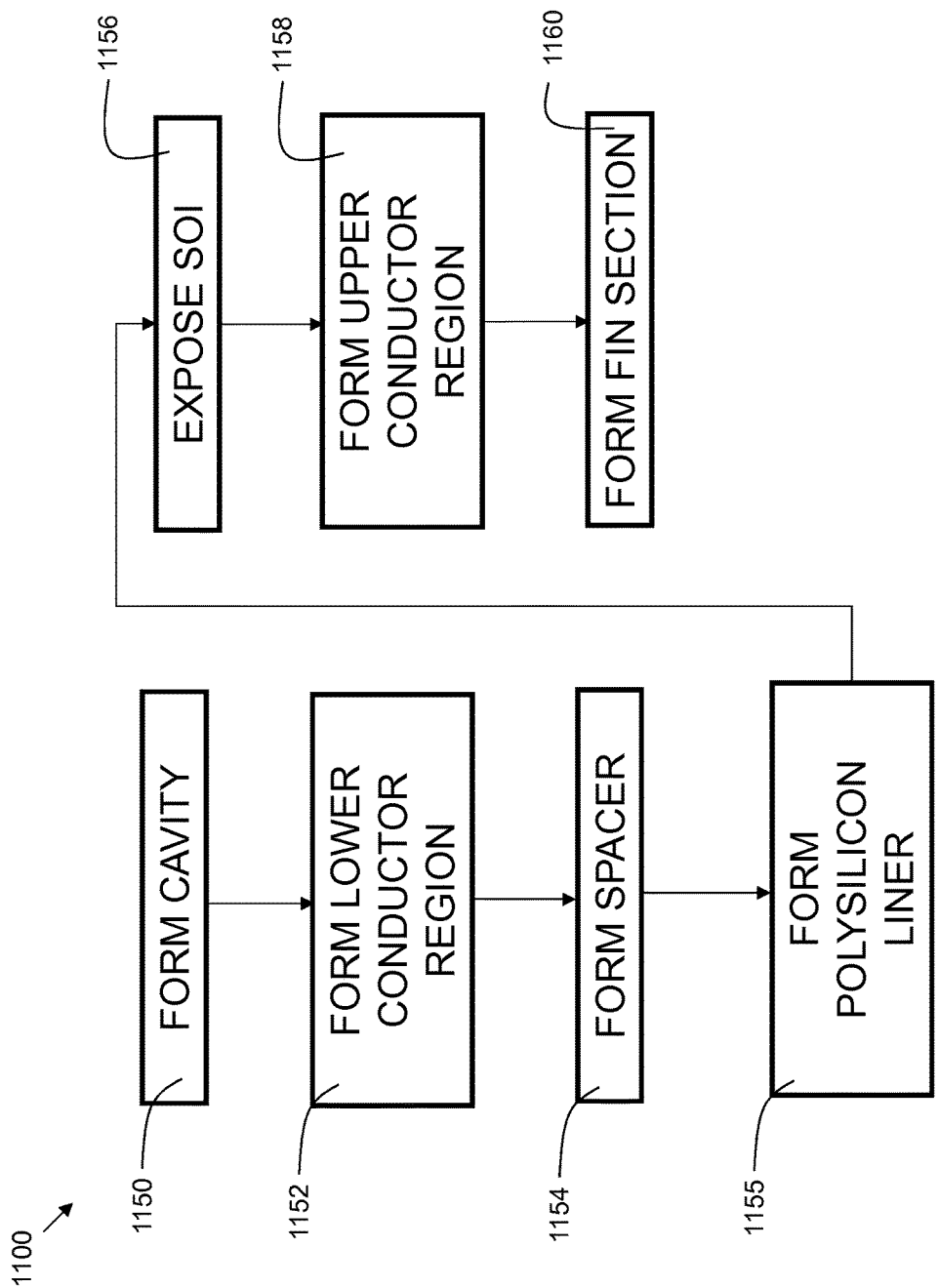

US 9,960,168 B2

1

CAPACITOR STRAP CONNECTION STRUCTURE AND FABRICATION METHOD

FIELD OF THE INVENTION

The present invention relates generally to semiconductor fabrication, and more particularly, to a capacitor strap/connection structure and fabrication method.

BACKGROUND OF THE INVENTION

Electronic devices are becoming more powerful, and more portable, with each passing generation of technology. To accommodate the increased power and portability, increased memory on devices is becoming essential. Dynamic Random Access Memory (DRAM) is a memory technology frequently used in computing devices such as mobile computing, embedded computing, and other computing applications. The circuit density of DRAM is a factor in determining how much memory can fit in a particular integrated circuit package. A higher density leads to more memory on the integrated circuit. However, increased circuit density can also lead to manufacturing challenges that may adversely impact product yield. It is therefore desirable to have improved structures and methods to allow increased circuit density while mitigating issues with product yield.

SUMMARY OF THE INVENTION

In a first aspect, embodiments of the present invention provide a method of forming a semiconductor structure, comprising: forming a cavity in a semiconductor substrate; forming a lower portion of a conductor region in the cavity; forming an annular spacer within the cavity and on the lower portion of the conductor region; forming an upper portion of the conductor region on the lower portion of the conductor region, within the annular spacer; and forming a fin portion on the upper portion of the conductor region; and in contact with a semiconductor-on-insulator region that is disposed over the semiconductor substrate.

In a second aspect, embodiments of the present invention provide a method of forming a semiconductor structure, comprising: forming a cavity in a semiconductor substrate; forming a lower portion of a conductor region in the cavity; forming an annular nitride liner within the cavity and on the lower portion of the conductor region; forming an annular spacer within the annular nitride liner and on the lower portion of the conductor region; forming an upper portion of the conductor region on the lower portion of the conductor region, within the annular spacer; recessing the annular spacer; recessing the annular nitride liner; forming a silicide region on a top portion of the annular spacer, wherein the silicide region is in contact with a semiconductor-on-insulator region that is disposed over the semiconductor substrate; forming a fin portion on the upper portion of the conductor region, wherein the fin portion is in contact with the silicide region.

In a third aspect, embodiments of the present invention provide a semiconductor structure, comprising: a semiconductor substrate; an insulator layer disposed on the semiconductor substrate; a semiconductor-on-insulator layer disposed on the insulator layer; a trench formed within the semiconductor substrate; a conductor region disposed in the trench, wherein the conductor region comprises a lower portion comprising a first diameter and an upper portion comprising a second diameter, wherein the second diameter is smaller than the first diameter, and a fin portion disposed

2 on the upper portion; and an annular spacer region disposed around the upper portion of the conductor region.

BRIEF DESCRIPTION OF THE DRAWINGS

The structure, operation, and advantages of the present invention will become further apparent upon consideration of the following description taken in conjunction with the accompanying figures (FIGS.). The figures are intended to be illustrative, not limiting.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

Figure 1A:
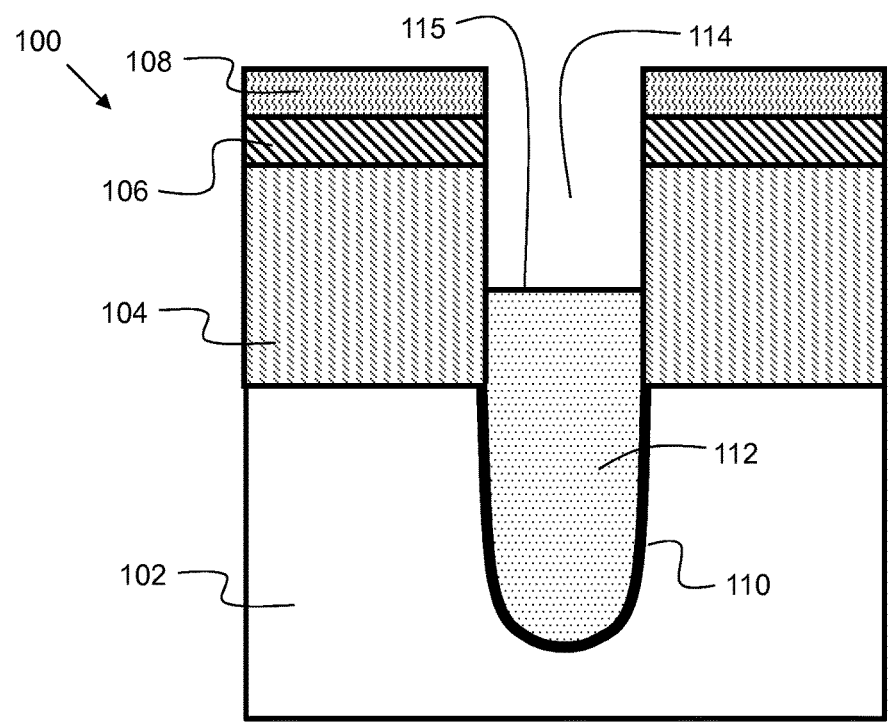

Often, similar elements may be referred to by similar numbers in various figures (FIGS) of the drawing, in which case typically the last two significant digits may be the same, the most significant digit being the number of the drawing figure (FIG). Furthermore, for clarity, some reference numbers may be omitted in certain drawings.

FIG. 1A is a starting point for embodiments of the present invention.

Figure 1B:
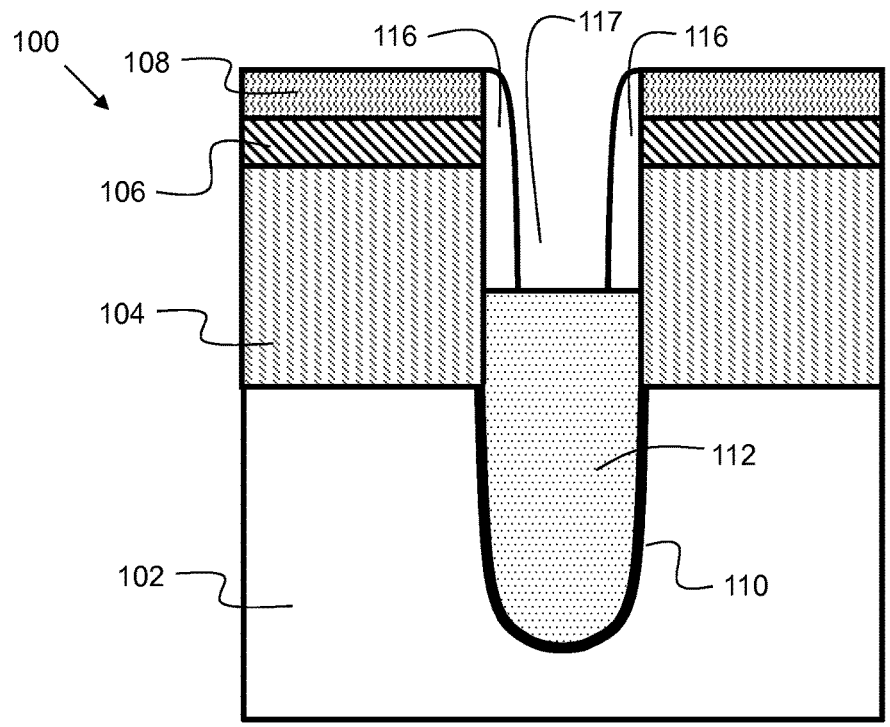

FIG. 1B shows an embodiment after a subsequent process step of spacer formation.

Figure 1C:
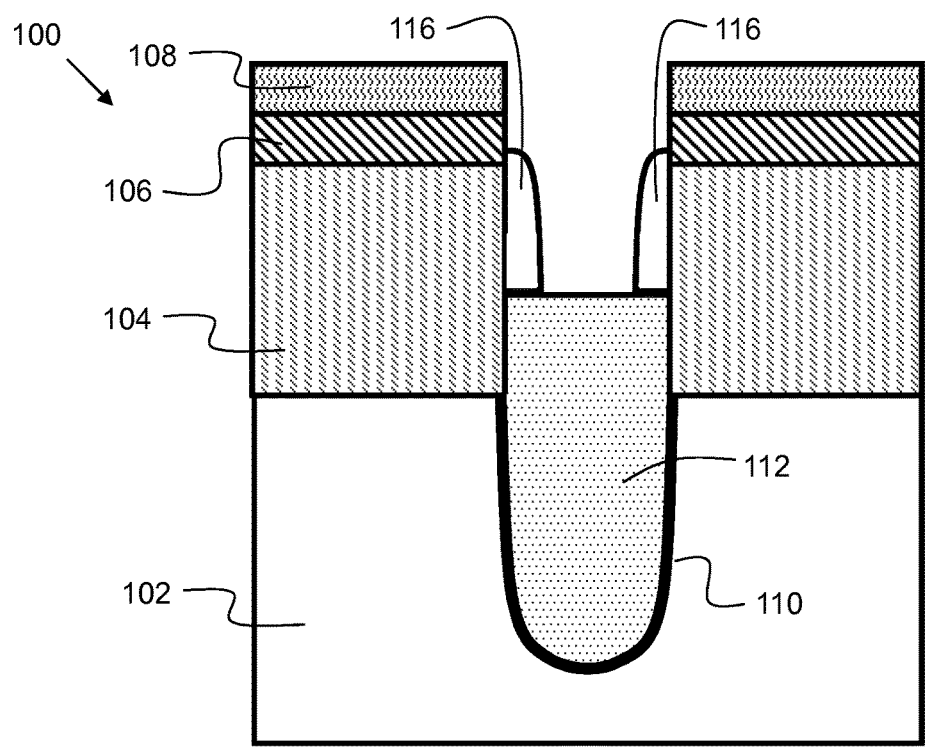

FIG. 1C shows an embodiment after a subsequent process step of spacer recess.

Figure 1D:
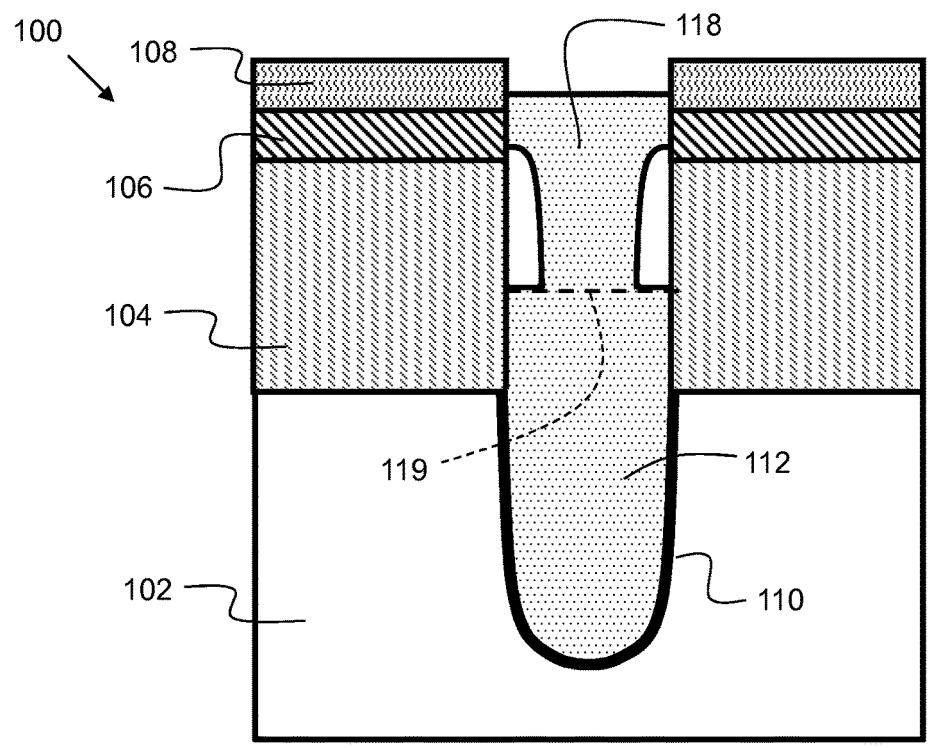

FIG. 1D shows an embodiment after a subsequent process step of forming an upper portion of the conductor.

Figure 1E:
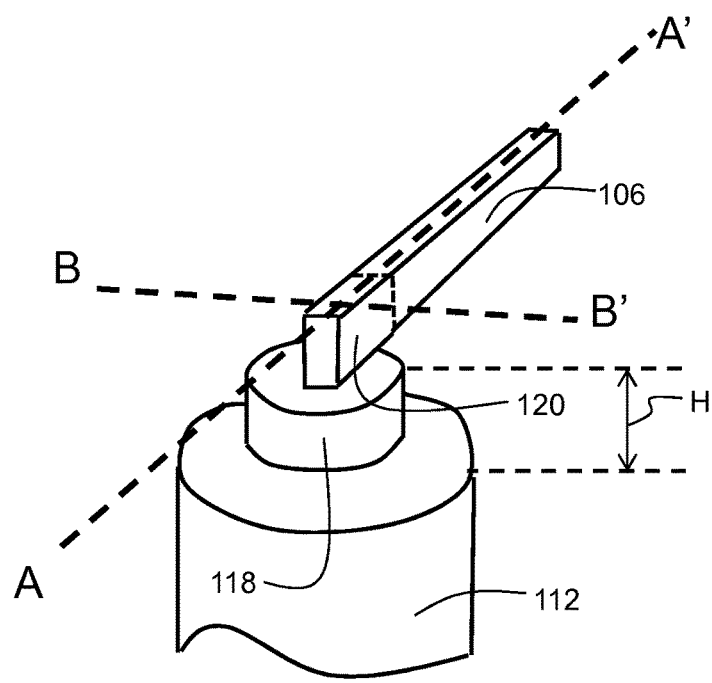

FIG. 1E shows a perspective view of a semiconductor structure after forming a fin portion.

Figure 1F:
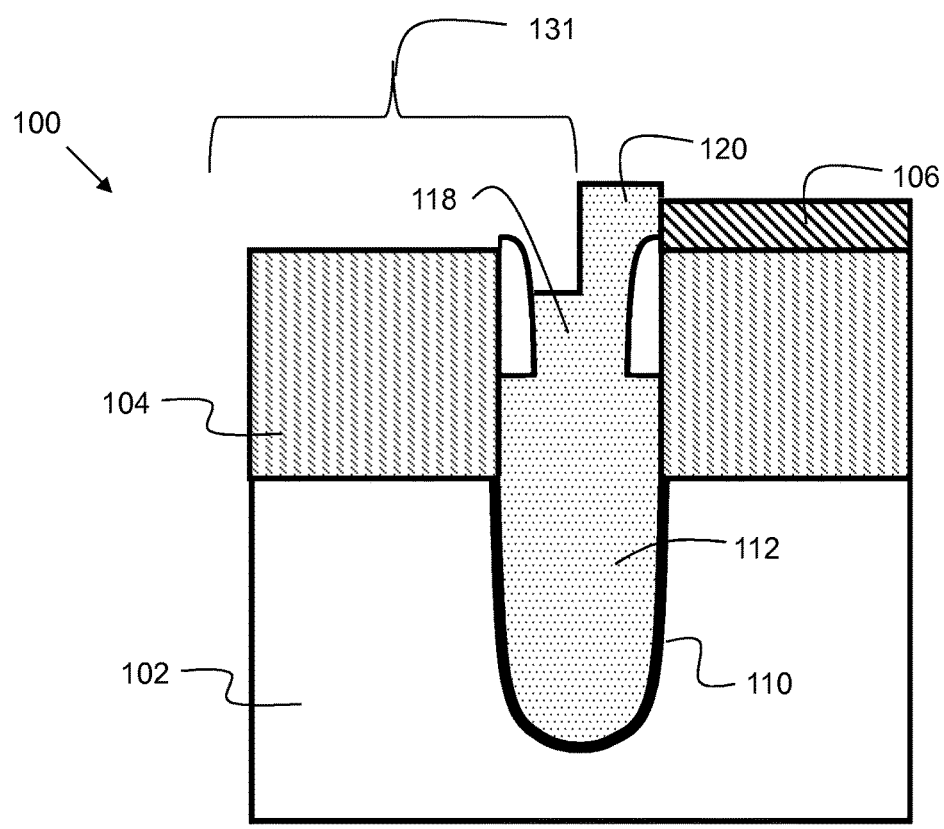
Figure 1G:
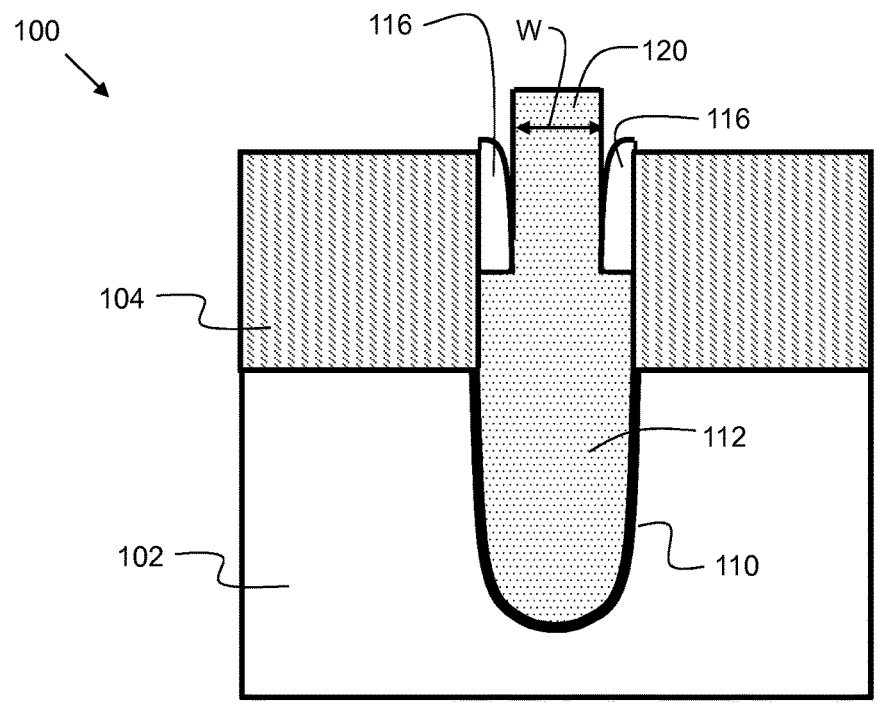

FIG. 1F shows a side view along line A-A' of FIG. 1E.
FIG. 1G shows a side view along line B-B' of FIG. 1E.

Figure 1H:
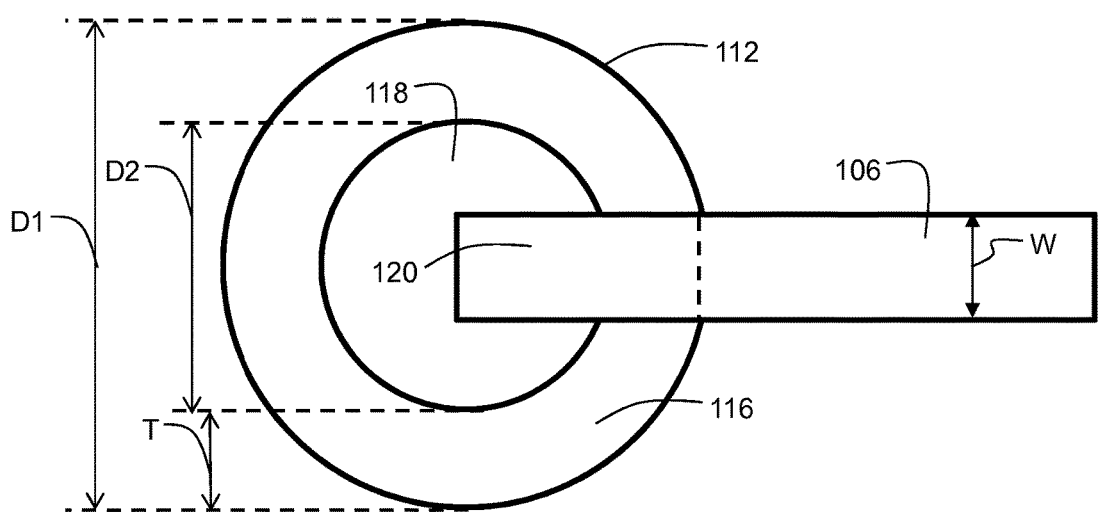

FIG. 1H is a top-down view of the semiconductor structure of FIG. 1E.

Figure 1I:
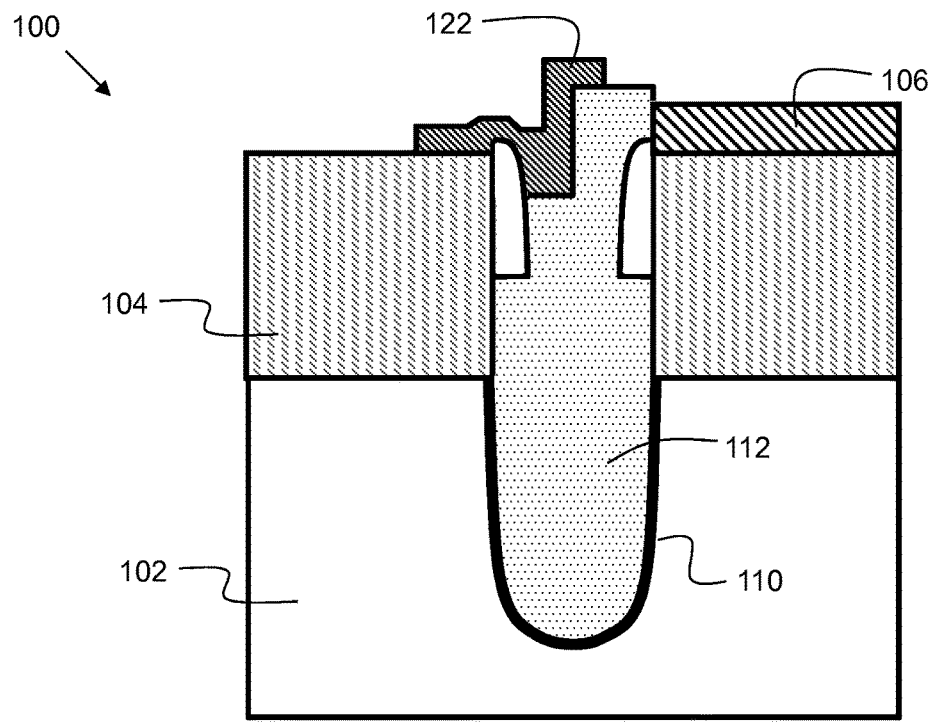

FIG. 1i shows a side view along line A-A' of FIG. 1E after a subsequent process step of forming a conformal oxide layer on a part of trench top surface.

Figure 1J:
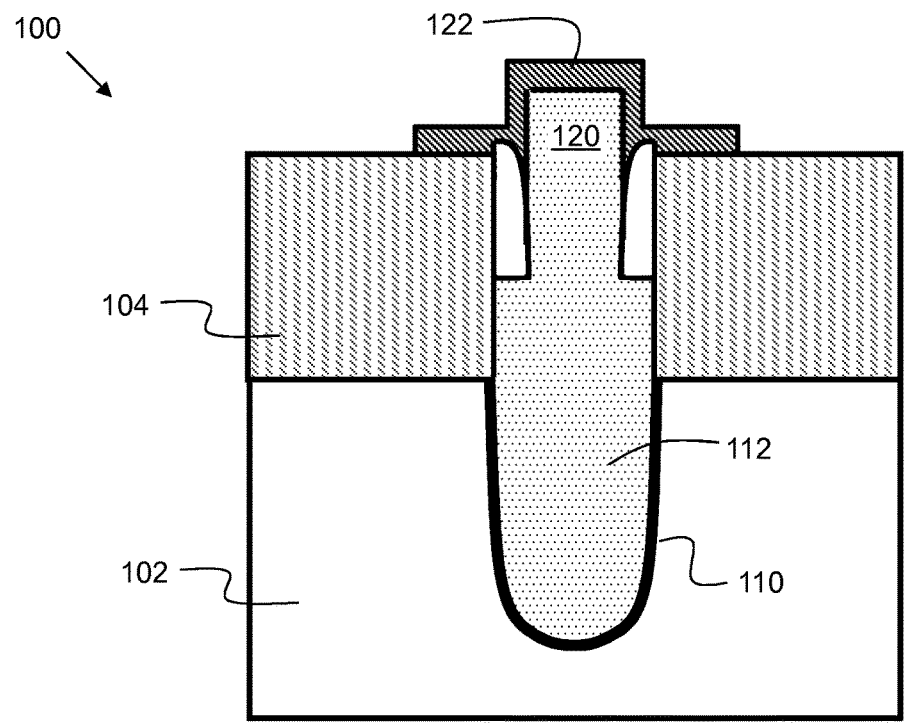

FIG. 1J shows a side view along line B-B' of FIG. 1E after a subsequent process step of forming a conformal oxide layer on a part of trench top surface.

Figure 2A:
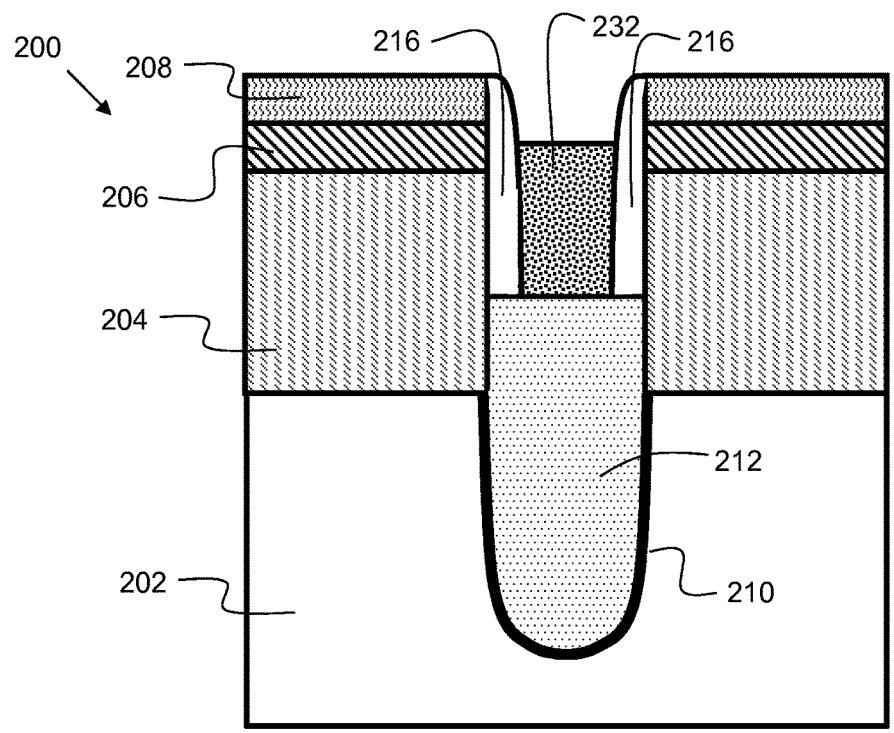

FIG. 2A shows deposition of a sacrificial layer in accordance with an alternative embodiment.

Figure 2B:
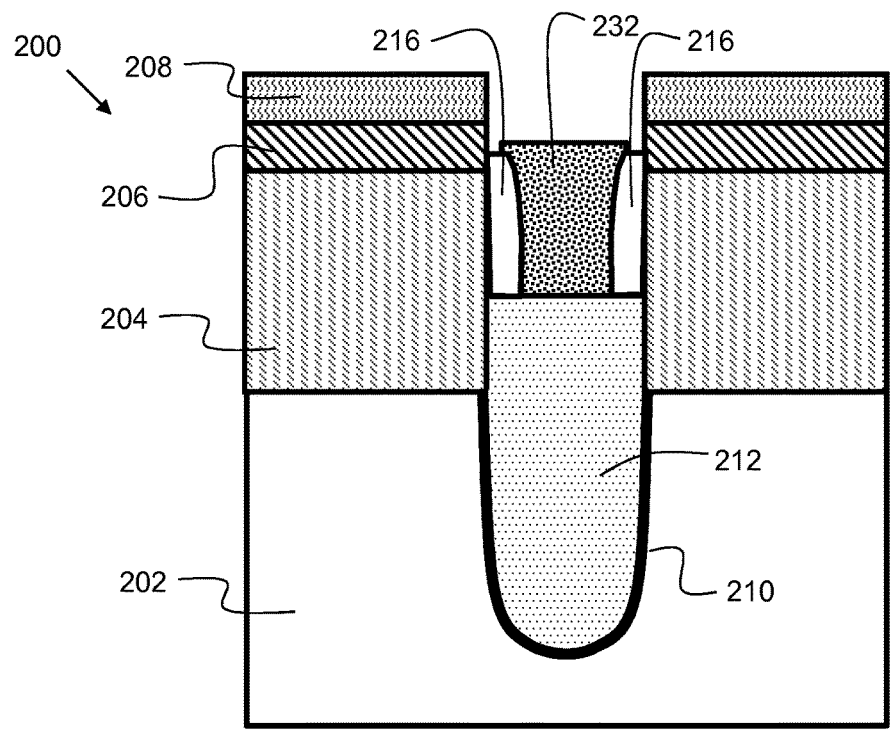

FIG. 2B shows an alternative embodiment after a subsequent process step of spacer recess.

Figure 2C:
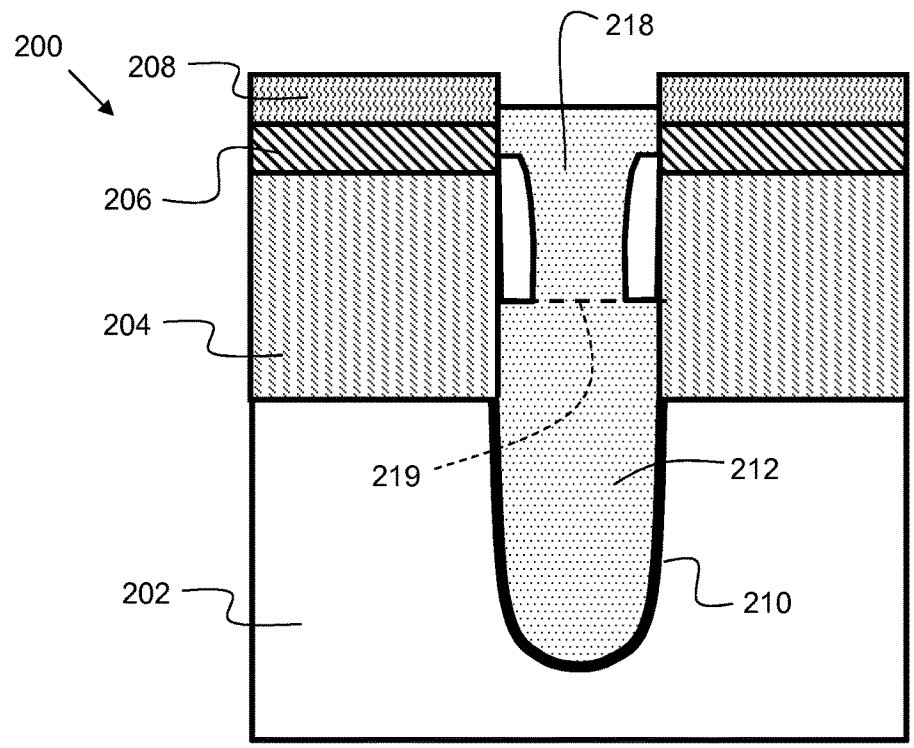

FIG. 2C shows an alternative embodiment after a subsequent process step of forming an upper portion of the conductor.

Figure 3A:
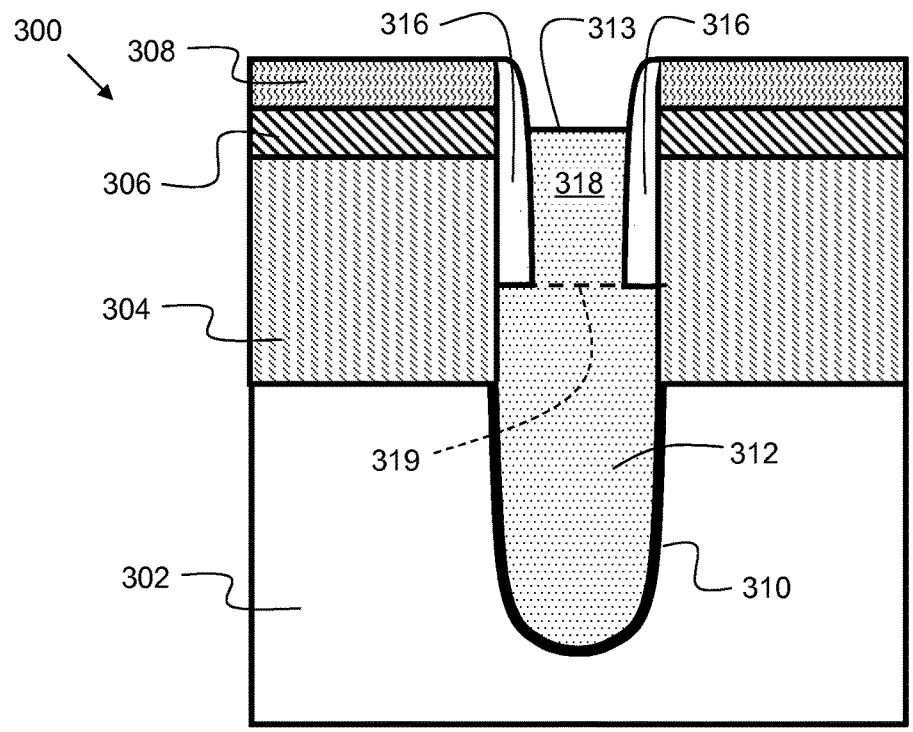

FIG. 3A shows formation of an upper portion of the conductor in accordance with another alternative embodiment.

Figure 3B:
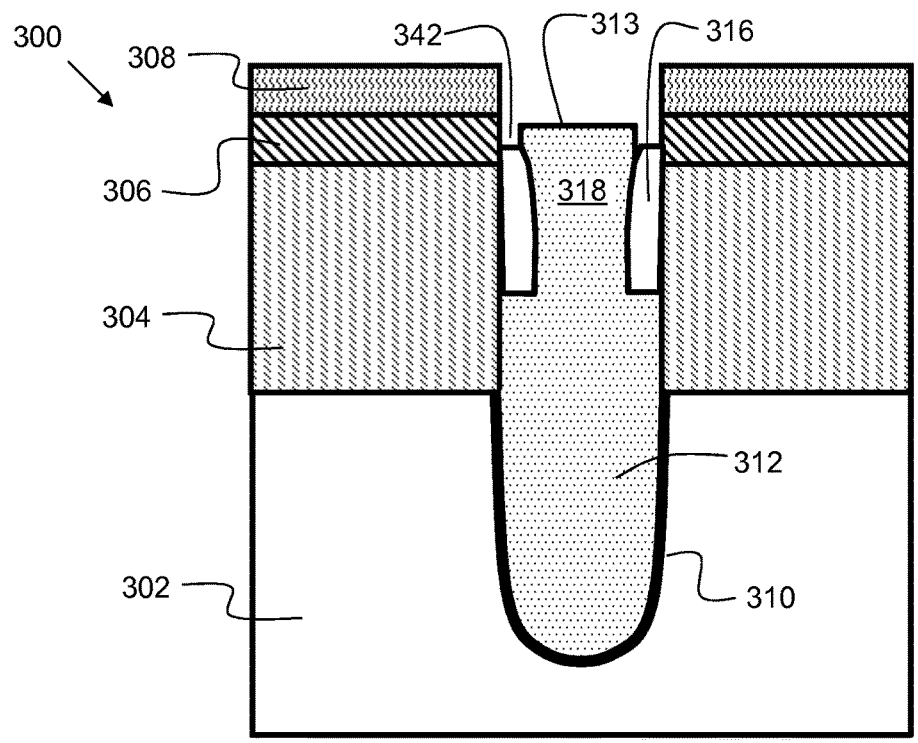
Figure 3C:
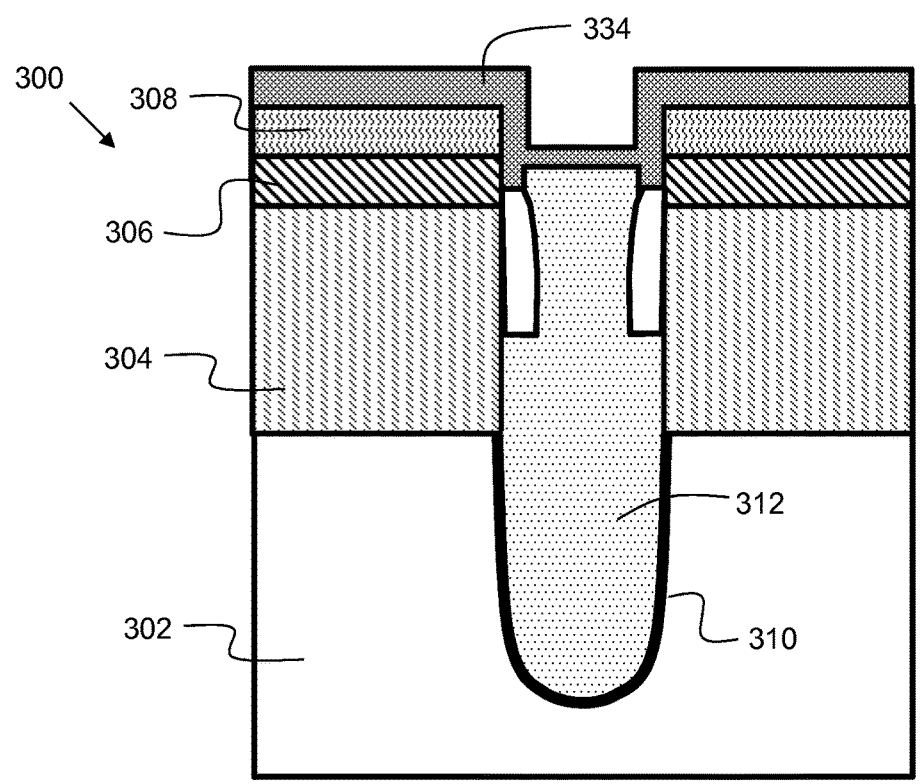

FIG. 3B shows a subsequent process step of spacer recess.
FIG. 3C shows a subsequent process step of polysilicon deposition.

Figure 3D:
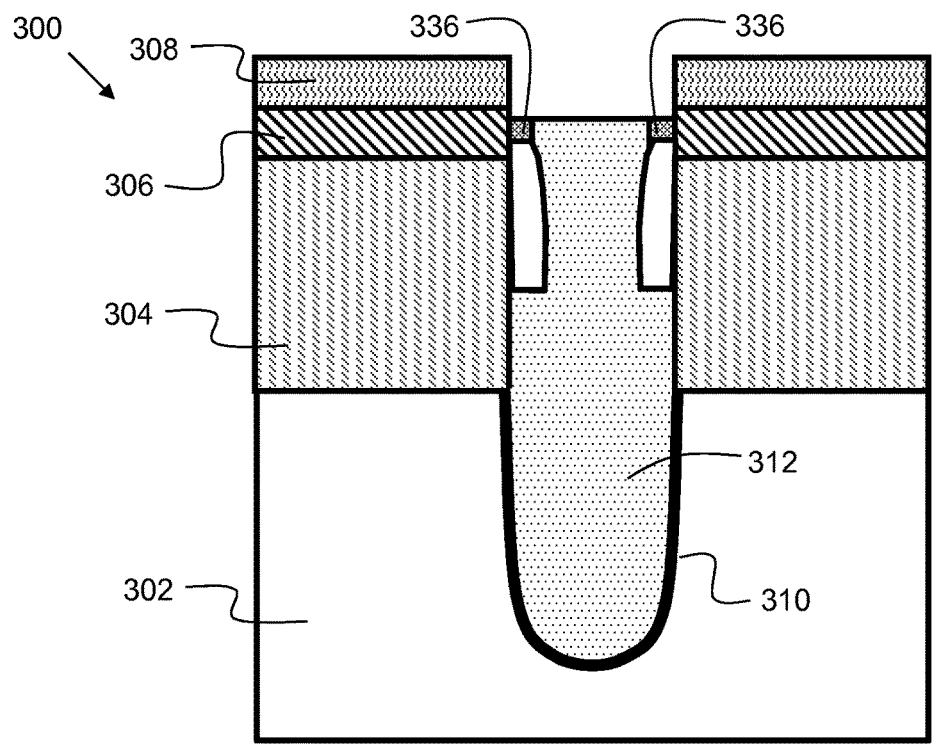

FIG. 3D shows a subsequent process step of polysilicon recess.

Figure 4A:
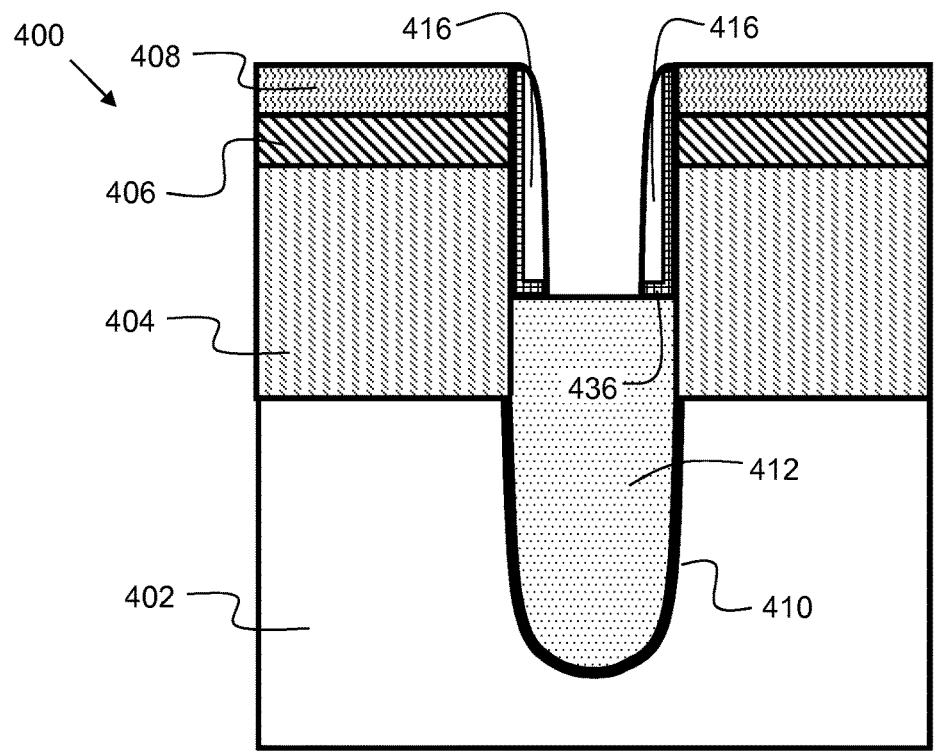

FIG. 4A shows spacer formation in accordance with another alternative embodiment.

Figure 4B:
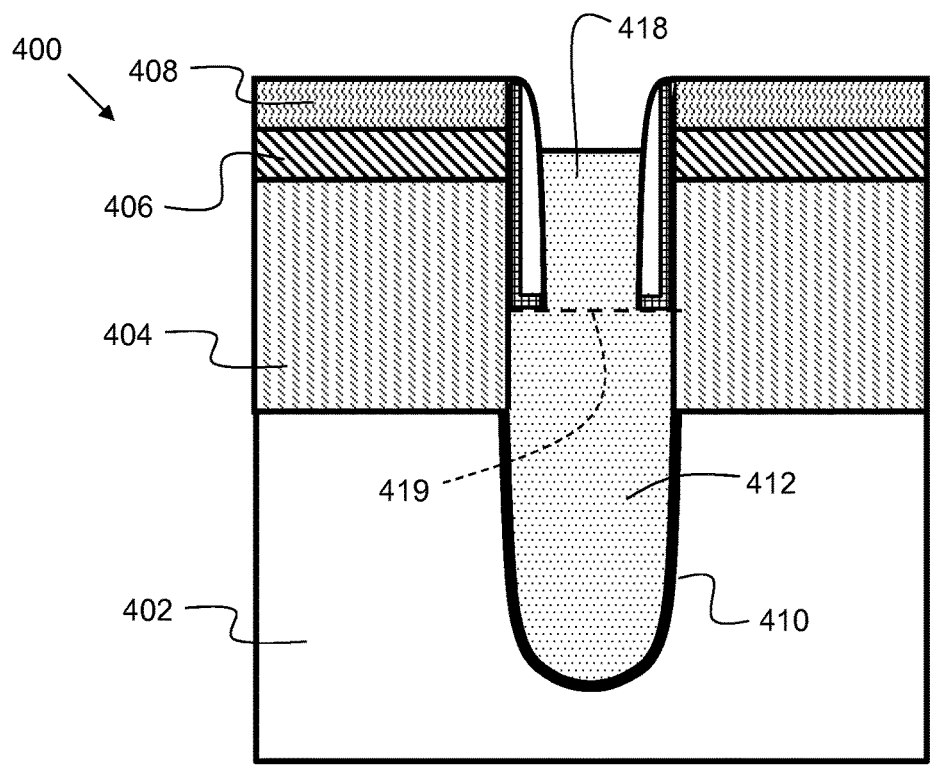

FIG. 4B shows formation of an upper portion of the conductor.

Figure 4C:
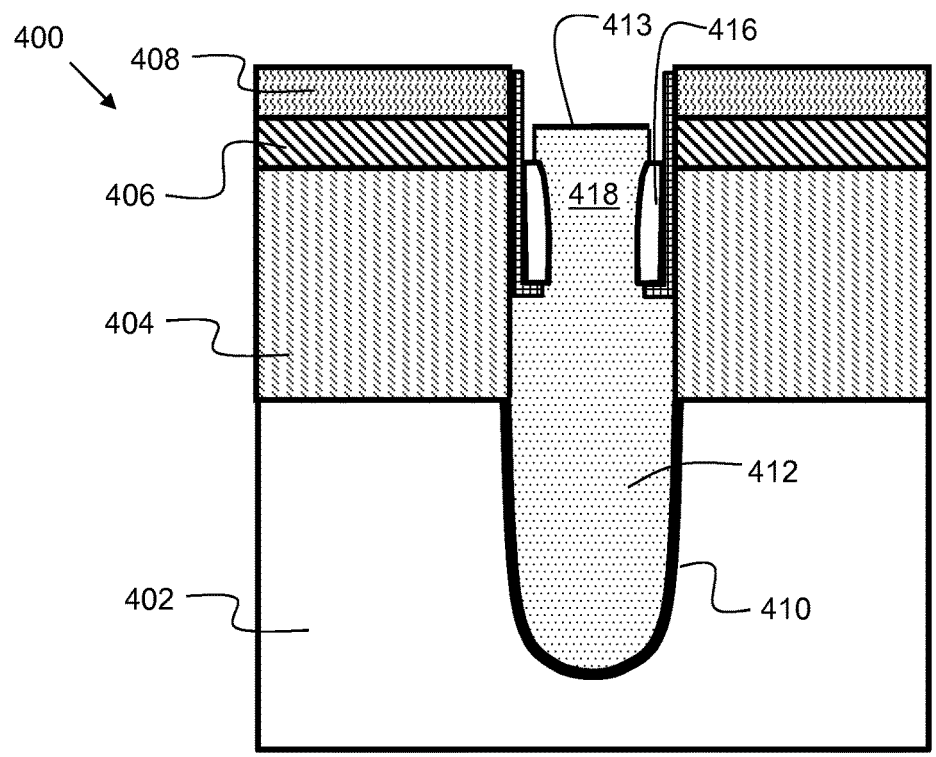

FIG. 4C shows a semiconductor structure after performing a spacer recess.

Figure 4D:
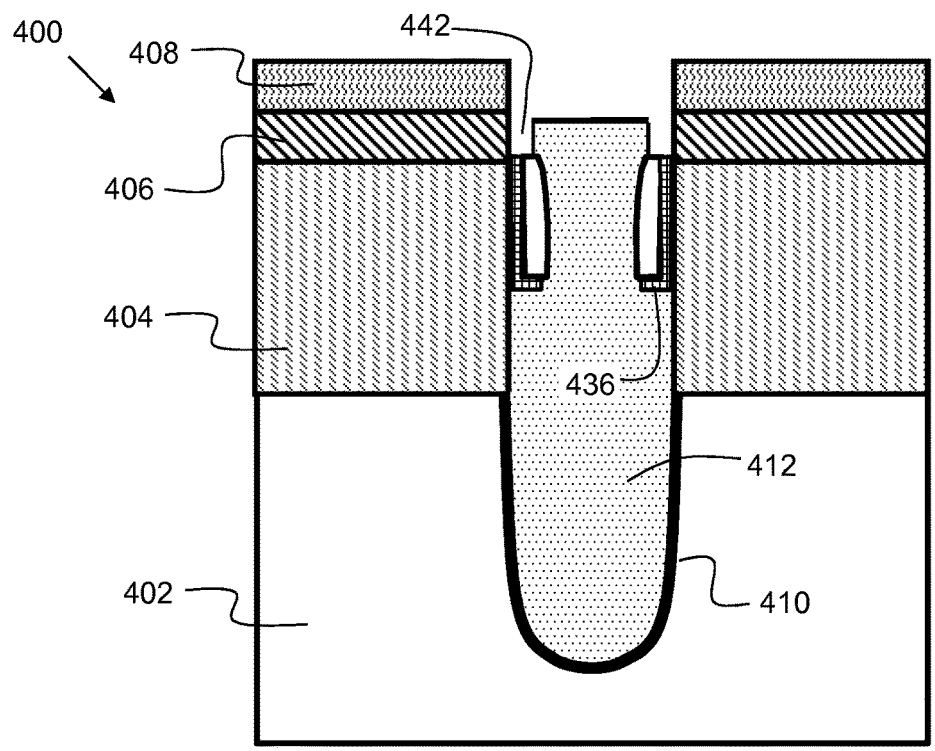

FIG. 4D shows a semiconductor structure after removing a portion of the liner.

Figure 4E:
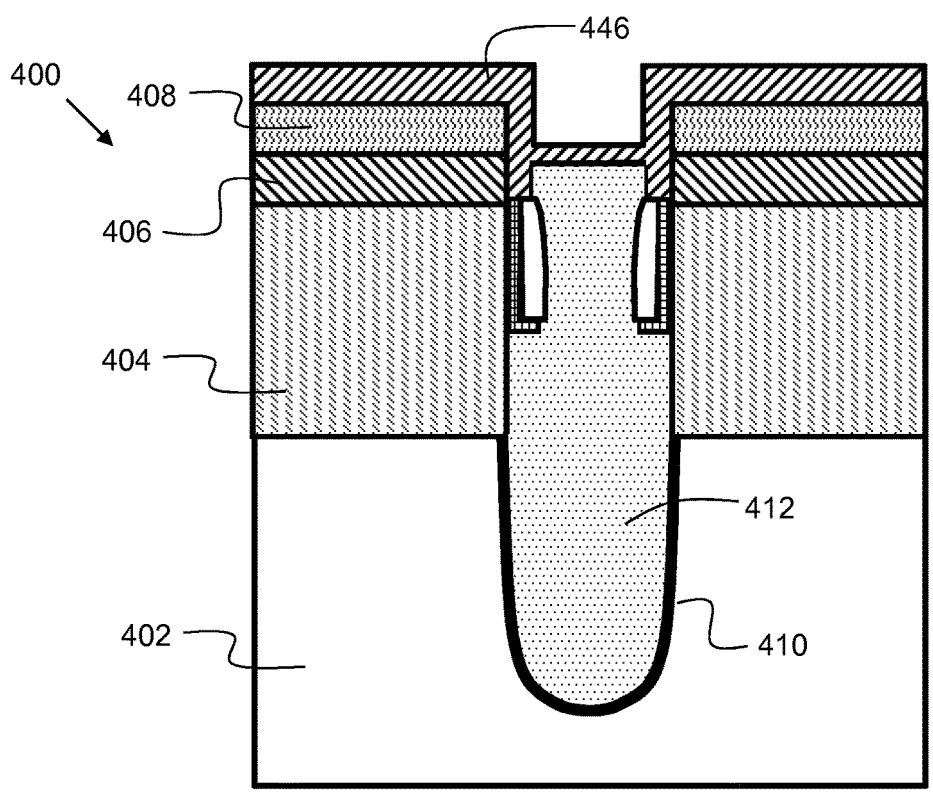

FIG. 4E shows a semiconductor structure after performing a metal deposition.

Figure 4F:
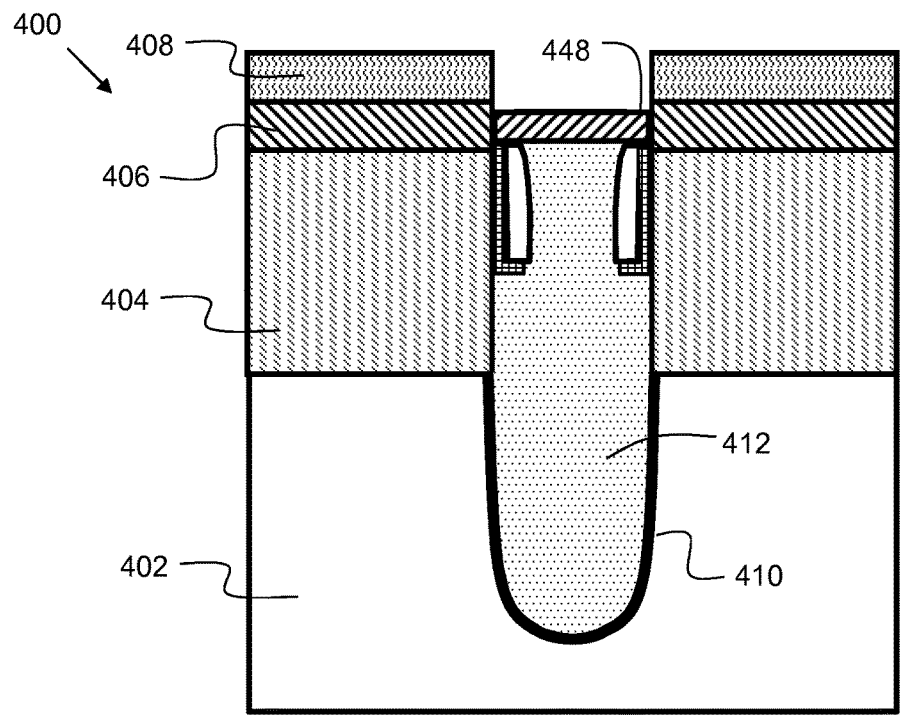

FIG. 4F shows a semiconductor structure after silicide formation.

Figure 4G:
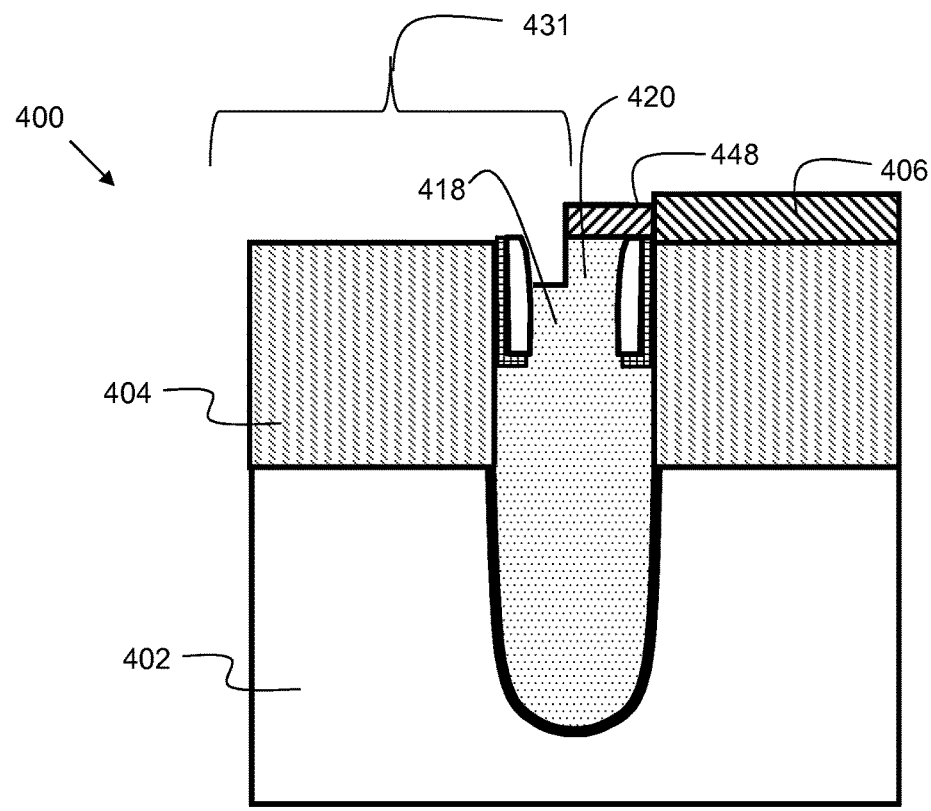

FIG. 4G shows a side view along line A-A' of FIG. 1E after forming a fin portion.

Figure 4H:
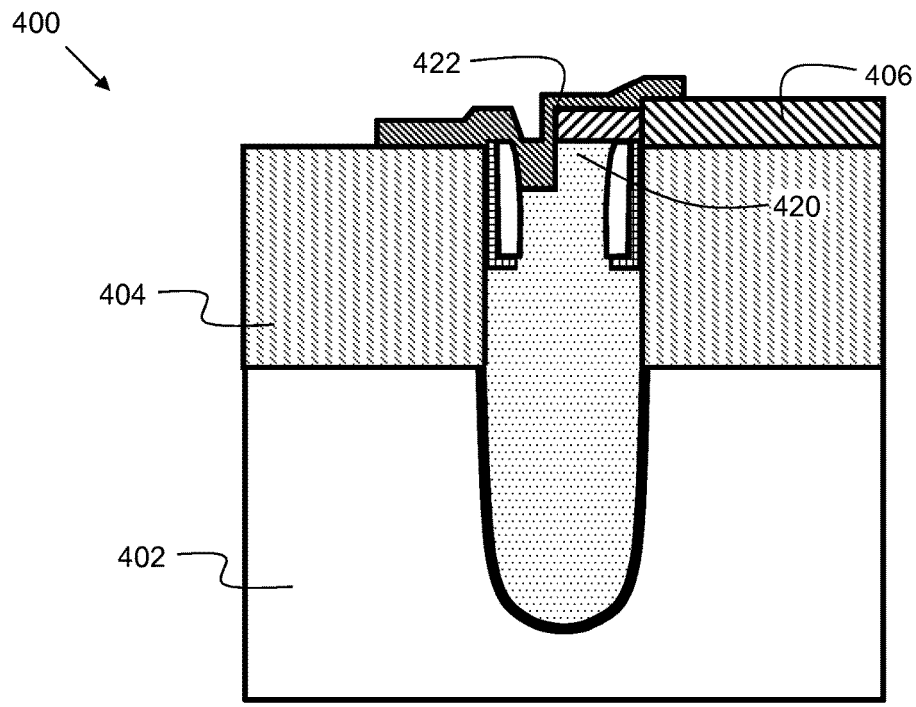

FIG. 4H shows a side view along line A-A' of FIG. 1E after a subsequent process step of forming a conformal oxide layer on a part of trench top surface.

Figure 4I:
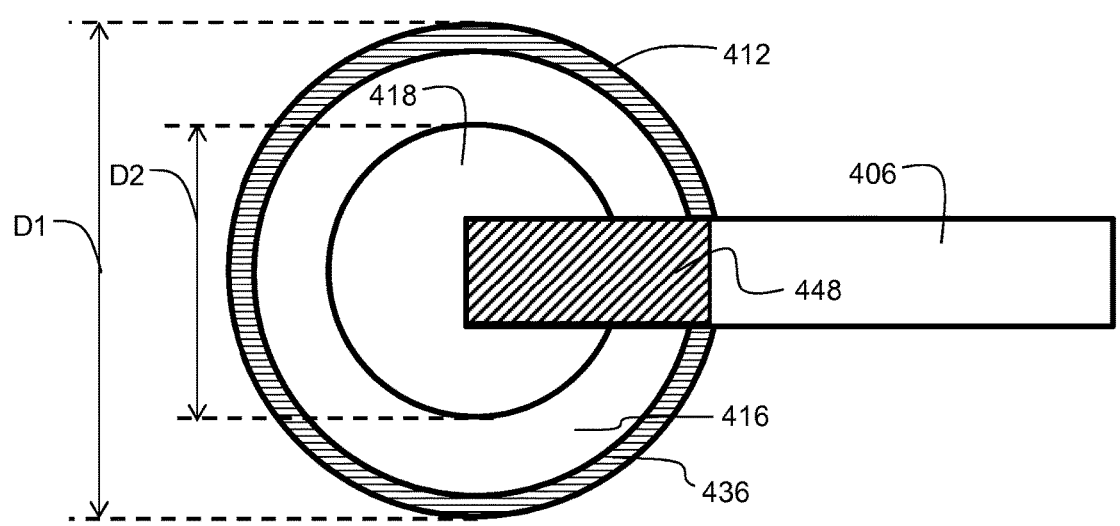

FIG. 4i is a top-down view of the semiconductor structure of FIG. 4H.

Figure 5A:
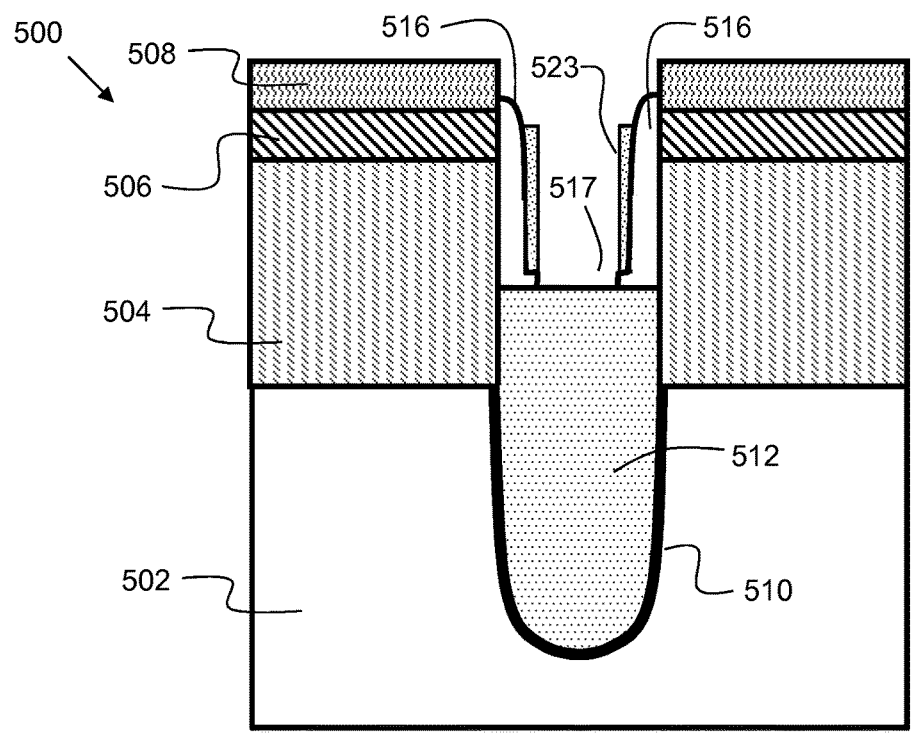

FIG. 5A shows spacer formation in accordance with another alternative embodiment.

Figure 5B:
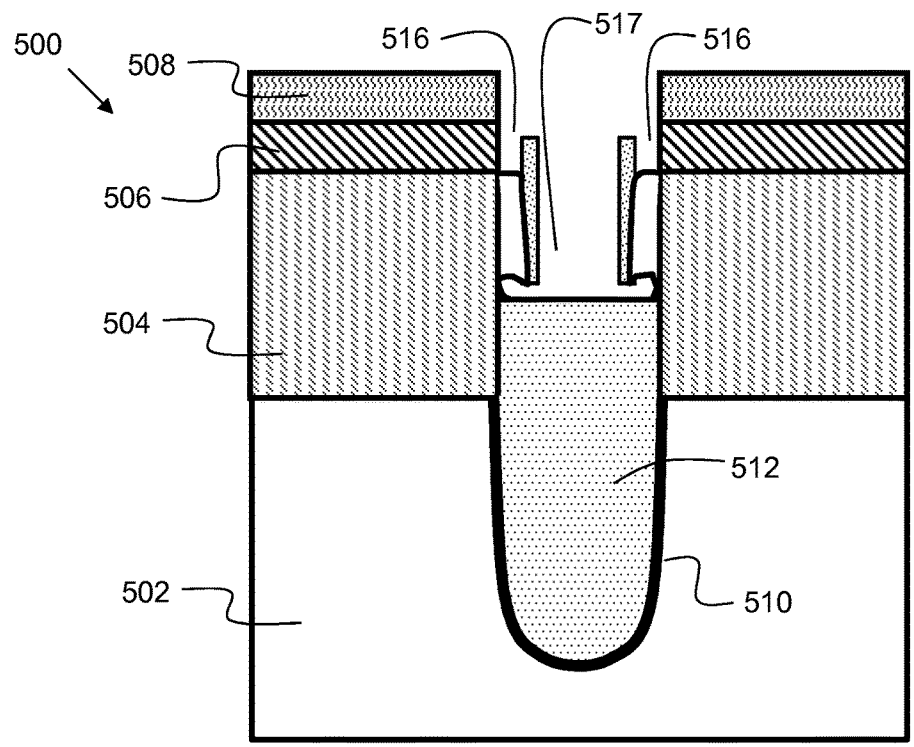
Figure 5C:
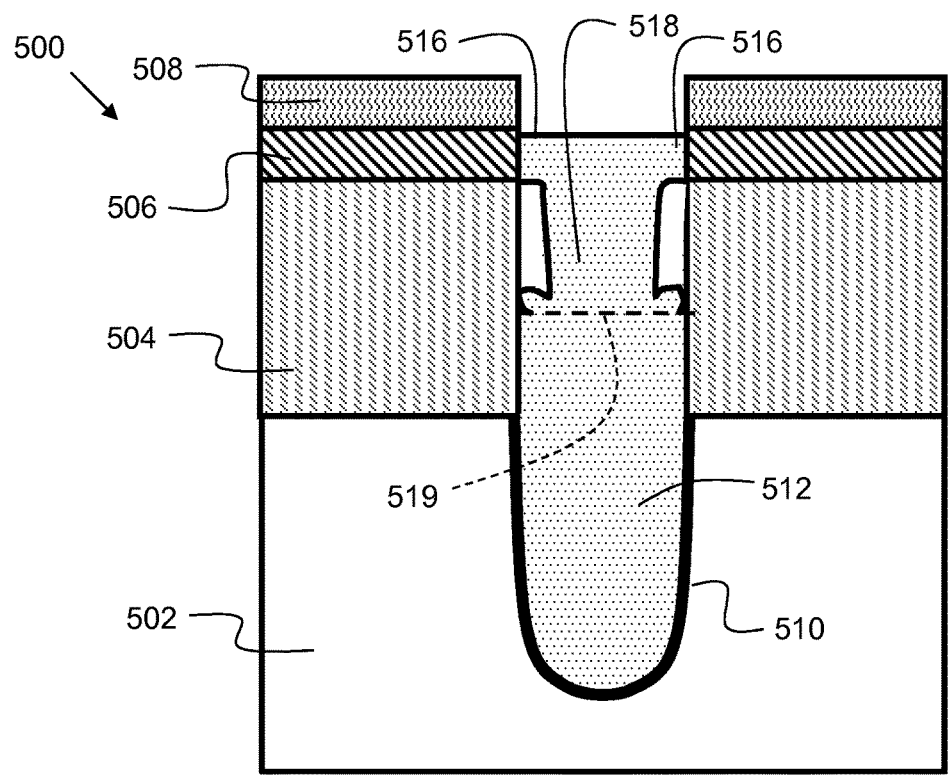

FIG. 5B shows a semiconductor structure after recess of the spacer to expose the SOI region. FIG. 5C shows formation of an upper portion of the conductor.

Figure 6:
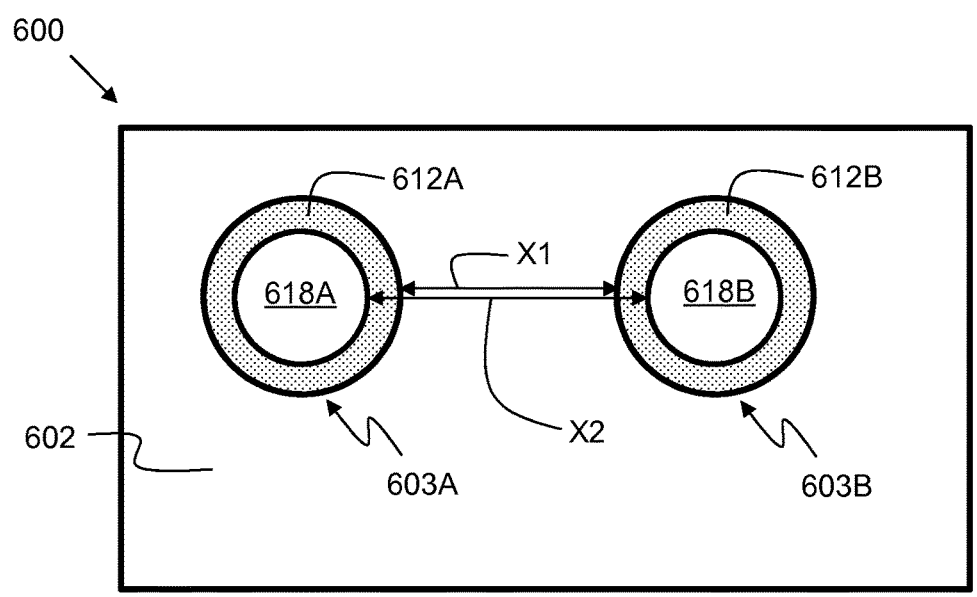

FIG. 6 shows a top-down view of trench capacitors in accordance with embodiments of the present invention.

Figure 7:
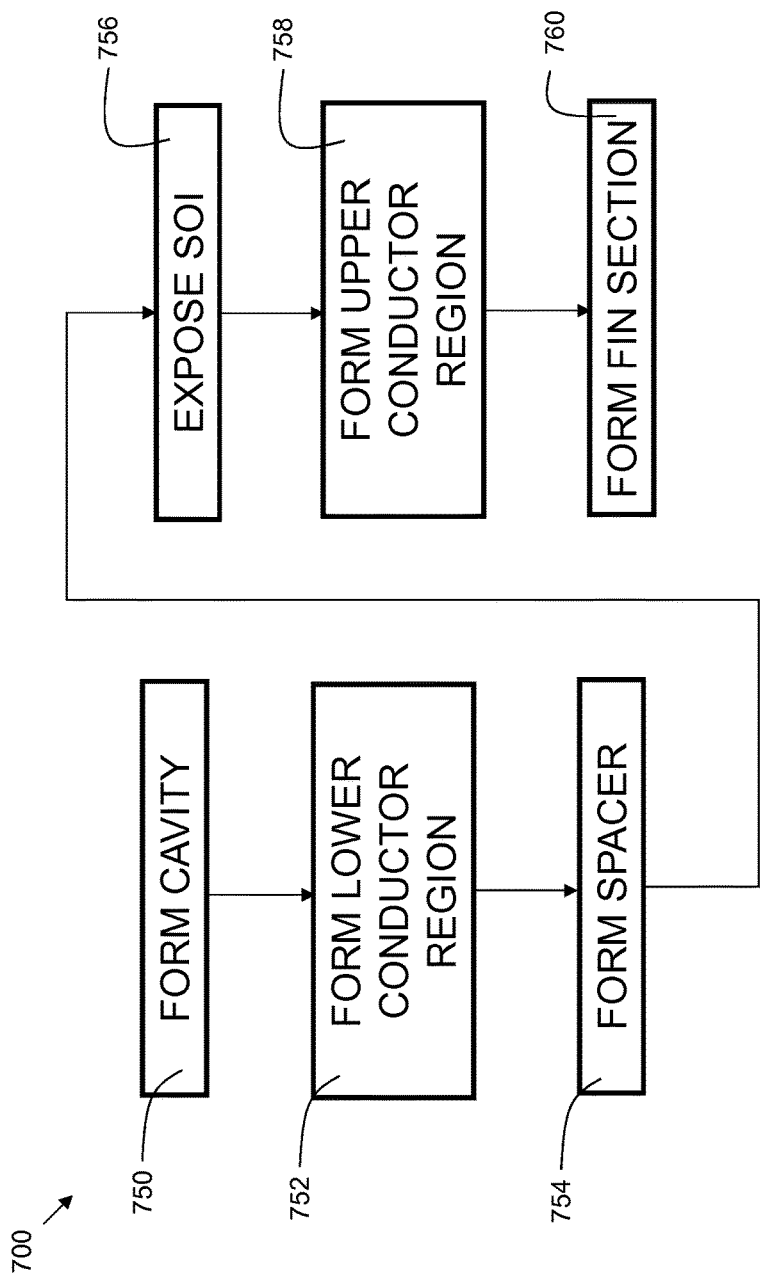

FIG. 7 shows a flowchart for embodiments of the present invention.

Figure 8:
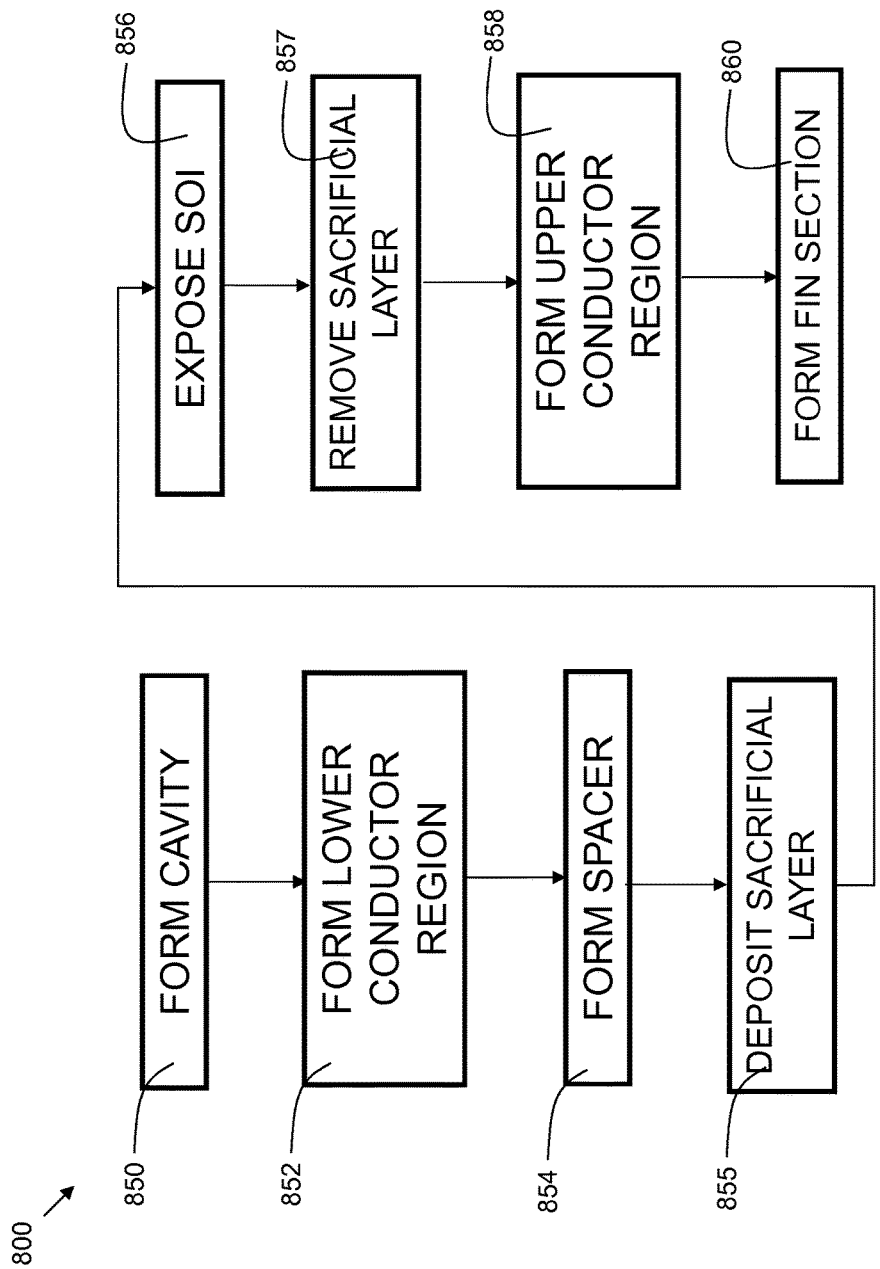

FIG. 8 shows a flowchart for alternative embodiments of the present invention utilizing a sacrificial layer.

Figure 9:
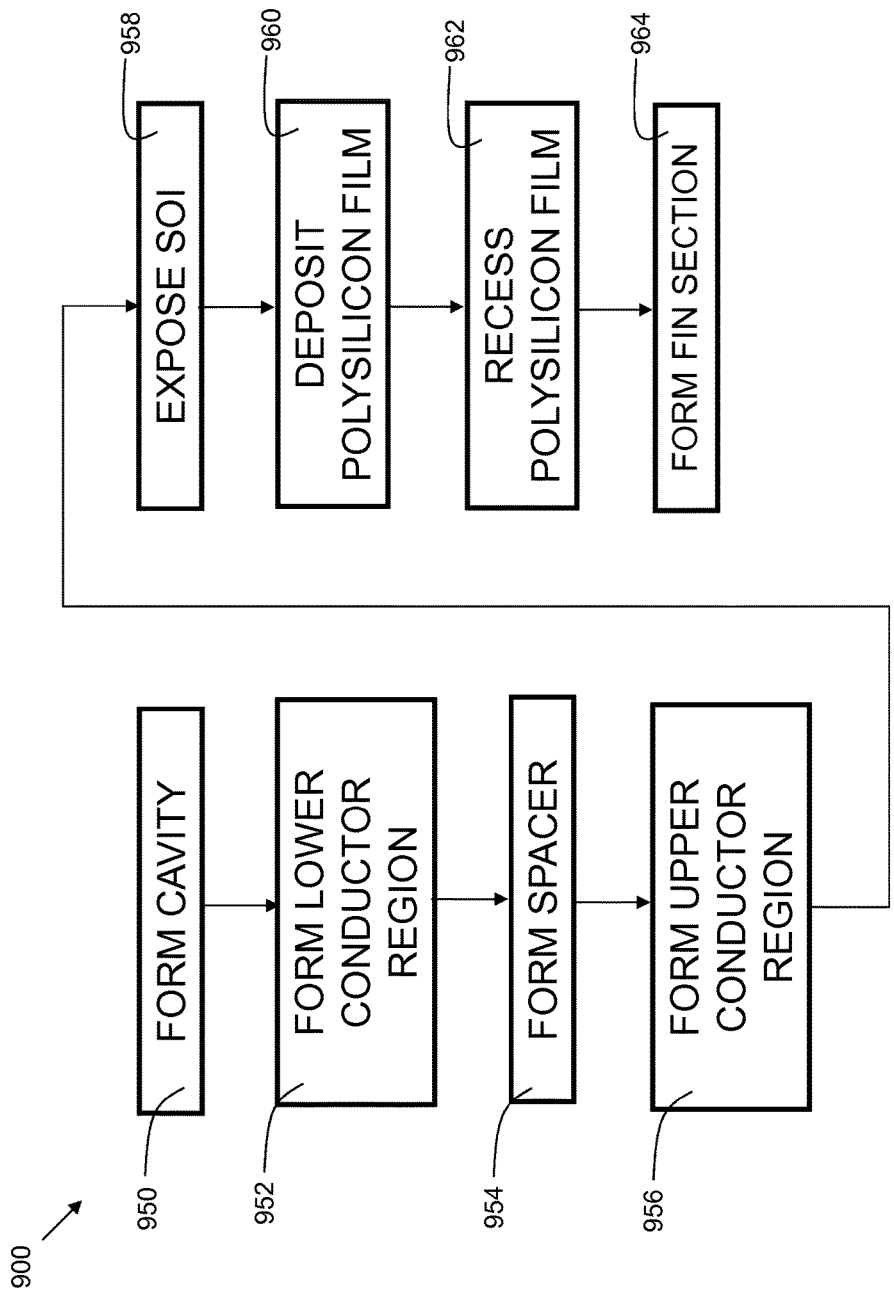

FIG. 9 shows a flowchart for alternative embodiments of the present invention utilizing a blanket polysilicon layer.

Figure 10:
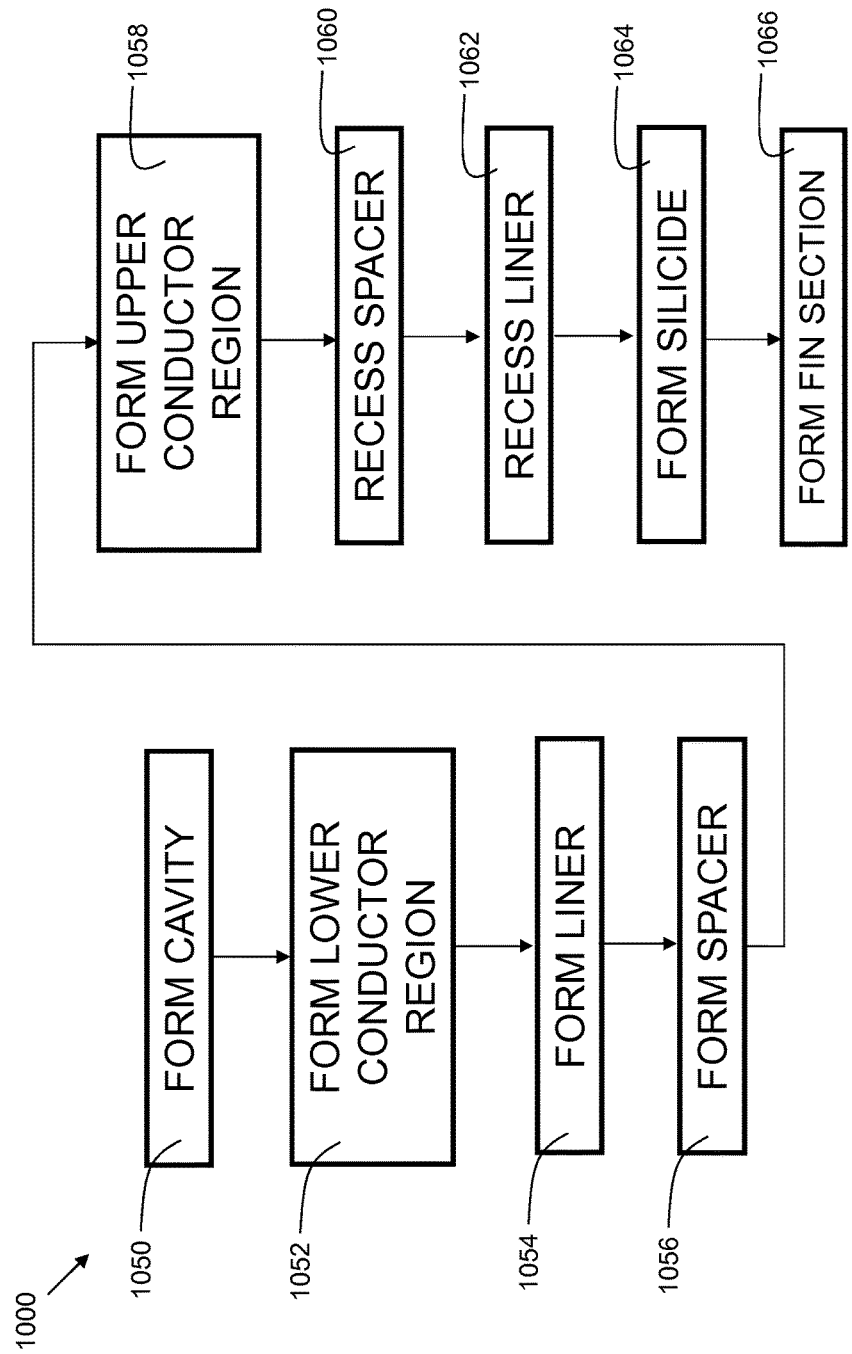

FIG. 10 shows a flowchart for alternative embodiments of the present invention utilizing a silicide region.

FIG. 11 shows a flowchart for alternative embodiments of the present invention utilizing a polysilicon liner.

DETAILED DESCRIPTION

Embodiments of the present invention provide improved structures and methods for deep trench capacitor connections. Deep trench capacitors are commonly used in DRAM devices as storage capacitors. In semiconductor-on-insulator (SOI) technology with fin-type field effect transistor (fin-FET) devices, the epitaxial material grown to make the connection between the transistor and capacitor has a tendency to merge with a neighboring capacitor, thus causing a short.

Embodiments of the present invention provide a structure with a reduced diameter top portion of the capacitor conductor. This increases the effective spacing between neighboring deep trench capacitors. Silicide or additional polysilicon may be deposited to complete the connection between the deep trench capacitor and a neighboring transistor.

FIG. 1A shows a semiconductor structure 100 at a starting point for embodiments of the present invention. Semiconductor structure 100 comprises bulk semiconductor substrate 102, which is often referred to as a handle wafer in SOI technology, which may comprise a silicon substrate, silicon-germanium substrate, or other suitable material. An insulator layer 104 and semiconductor layer 106 is bonded to handle wafer 102 in typical SOI formation technology. This bonding and complete SOI structure wafer is typically provided by wafer manufacture. In embodiments, the insulator layer 104 is comprised of silicon oxide, and may be referred to as a so-called "buried oxide" (BOX) layer. In embodiments, the SOI layer 106 may comprise silicon, silicon germanium, or other suitable material. A pad nitride layer 108 is disposed on the SOI layer 106 and serves to protect the SOI layer 106 during downstream processing. A thin oxide layer (not shown) may be deposited between SOI layer 106 and pad nitride 108 as a stress buffer for downstream thermal processing or as a protective layer for the SOI layer 106 for downstream process steps. A trench (cavity) 114 is formed through the nitride layer 108, SOI layer 106, insulator layer 104, and partially extending into, but not completely through the bulk semiconductor substrate 102. Once the cavity (trench) is formed, a liner 110 is formed on the interior surface of the trench along the bulk semiconductor substrate 102. Trench 114 is an important element for memory cell performance. Typical dimensions may range from about 50-150 nanometers in diameter and about 3-5 micrometers in depth, depending on ground rules. The liner 110 may include a high-K dielectric such as hafnium oxide, hafnium silicate, zirconium oxide, or other suitable material as capacitor dielectric film. The liner 110 may contain additional sub-layers (not shown), such as a titanium nitride liner on the surface of high K dielectric layer to promote conduction, and/or other diffusion barrier materials under the high K dielectric layer to maintain high K dielectric constant with downstream thermal process. In embodiments, the liner material can be terminated inside of insulator layer 104 instead of terminating at the bottom of insulator layer 104 in this drawing. A conductor region is then formed by depositing polysilicon with dopants (such as arsenic). The polysilicon is recessed to form a lower portion of the conductor region 112 in the cavity. The upper surface 115 of the lower portion of the conductor region 112 is at a level below the SOI layer 106 but above bottom of the insulator layer 104.

FIG. 1B shows semiconductor structure 100 after a subsequent process step of spacer formation. Oxide spacer 116 is formed in an upper portion of the cavity, such that the spacer material is disposed on the lower portion of the conductor region 112, and may be deposited with a conformal chemical vapor deposition (CVD) process, followed by anisotropic dry etching. In embodiments, the spacer thickness is 10-30 nm, depending on ground rule and the amount of epitaxial layer thickness in subsequent process steps. The sidewalls in the reduced-diameter upper cavity 117 include insulator layer 104, SOI layer 106, and nitride layer 108. Hence, the spacers serve to reduce the opening of cavity (trench) 117 which increases distance between neighboring trenches (not shown in this drawing). In embodiments, the spacers 116 are comprised of silicon oxide. The silicon oxide may be deposited using a conformal CVD process or ALD (Atomic Layer Deposition) process and then dry etched to expose (open) the lower portion of the conductor region 112 and remove the silicon oxide from the top surface of pad nitride 108. In embodiments, the dry etching can be done under CF containing plasma with ambient temperature (0-50 degrees Celsius) in 5-100 mTorr pressure. In embodiments, the silicon oxide may be deposited to a thickness ranging from about 10 nanometers to about 15 nanometers.

FIG. 1C shows semiconductor structure 100 after a subsequent process step of additional spacer recess. As shown in FIG. 1C, spacers 116 are now recessed to adjust the spacer top surface level such that covers the insulator layer 104, while it exposes most of the SOI layer 106 on the cavity sidewalls. In embodiments, an anisotropic oxide etch is used to recess the spacers. This may include a reactive ion etch (RIE) process. A polymer forming gas flow rate can be adjusted to protect sidewall of spacer 116 while spacer is recessed. CF4 or C4F8 gas may be used for both polymer formation and spacer etch together.

FIG. 1D shows semiconductor structure 100 after a subsequent process step of forming an upper portion of the conductor region 118. The upper portion of the conductor region 118 may be formed by depositing additional polysilicon with doping, followed by a recess RIE etch. Imaginary line 119 denotes the boundary between the lower portion of the conductor region 112 and the upper portion of the conductor region 118.

FIG. 1E shows a perspective view of a semiconductor structure 100 after forming a fin portion. In this view, the bulk semiconductor substrate, liner, and spacers are not shown, to illustrate the features of the conductor regions 112 and 118. A portion of SOI layer 106 is formed in a fin shape, and is part of a finFET (not shown). The upper portion of the conductor region 118 is disposed on lower portion of the conductor region 112 and has a height H. The lower limit of H is top surface of lower portion of the conductor region 112. In embodiments, H may range from about 50 nanometers to about 100 nanometers. A section of the upper portion of the conductor region 118 is also formed into a fin shape, and serves as a trench top fin section (TTFS) 120. The TTFS may be formed using industry standard lithographic and patterning methods, including, but not limited to, a sidewall image transfer (SIT) process. Hence, a part of the upper portion of the conductor region 118 is removed to form TTFS 120.

FIG. 1F shows a side view of semiconductor structure 100 along line A-A' of FIG. 1E. As can be seen in FIG. 1F, the TTFS 120 is in direct physical contact with SOI layer 106. A section of the upper portion of the conductor region 118 is removed, and the SOI layer 106 is also removed from the area indicated by region 131 during the fin formation process.

FIG. 1G shows a side view of semiconductor structure 100 along line B-B' of FIG. 1E. As can be seen in FIG. 1F, the TTFS 120 is bounded by the spacers 116. The width W of 120 is the fin dimension and can be smaller than diameter D2 as shown in FIG. 1H.

FIG. 1H is a top-down view of the semiconductor structure of FIG. 1E. As can be seen in FIG. 1H, the lower portion of the conductor region 112 has a diameter D1, and the upper portion of the conductor region 118 has a diameter D2, where D2<D1. In embodiments, the second diameter D2 is about 10 percent to about 30 percent smaller than the first diameter D1. The smaller diameter D2 provides more separation between neighboring trench capacitors. The smaller D2 is, the more separation is achieved. However, if the diameter D2 is made too small, then increased contact resistance can adversely affect device performance. The range of D2 as about 10 to 30 percent smaller than D1 provides the benefit of increased separation without significant increase in contact resistance. As seen in this view, spacer 116 is annular and is disposed around the upper portion of the conductor region 118, and defines the diameter D2 of the upper portion of the conductor region 118. Hence, as the thickness T of the spacer 116 is increased, the diameter D2 of the upper portion of the conductor region 118 becomes smaller, as D2=D1−2*T.

FIG. 1i shows a side view of semiconductor structure 100 along line A-A' of FIG. 1E after a subsequent process step of depositing a conformal oxide layer 122 and removing portions of the oxide layer except as shown in FIG. 1i with typical lithography and dry or wet oxide etch process. The conformal oxide layer 122 serves to insulate a portion of the capacitor from conductors passing on top of the trench (not shown here) such as a so called passing word line.

FIG. 1J shows a side view along line B-B' of FIG. 1E after a subsequent process step of depositing conformal oxide layer 122. The conformal oxide layer 122 surrounds the sides and top of a portion of TTFS 120.

FIG. 2A shows a semiconductor structure 200 after a process step of deposition of a sacrificial layer in accordance with an alternative embodiment. FIG. 2A follows from FIG. 1B. As stated previously, similar elements may be referred to by similar numbers in various figures (FIGS) of the drawing, in which case typically the last two significant digits may be the same. For example, substrate 202 of FIG. 2A is similar to substrate 102 of FIG. 1A. The key difference in this embodiment is that instead of depositing additional polysilicon, a sacrificial layer 232 is filled inside of trench and recessed to the desired level by resist etching. Controlled oxygen plasma may be used for the resist etching. The sacrificial layer 232 serves to protect the sidewalls of spacer 216 during subsequent recess of spacer 216 step. In embodiments, the sacrificial layer 232 is comprised of photoresist and/or an organic planarization layer (OPL). Photoresist or OPL can be spin coated and can fill the trench with good planarity. In embodiments, the OPL recess can be done with a RIE process with end point control to adjust the recess depth (the depth between surface of pad nitride and surface of OPL surface). In practice, anisotropic etch processes of spacer recess in FIG. 1, such as a RIE may not be ideal, and in reality, some non-linear etching can occur. Preferably, the sidewalls of spacer 216 should be as close to vertical as possible, so that when polysilicon is later deposited to form the upper portion of the conductor region, it is of a consistent diameter throughout.

FIG. 2B shows semiconductor structure 200 after a subsequent process step of spacer recess. As can be seen in FIG. 2B, the spacer 216 (conformal oxide layer) is recessed to a level below a top of the sacrificial layer 232, and below the top level of the SOI layer 206, such that most of the SOI layer 206 is exposed on the sidewalls of the cavity. However, the top level of the spacer 216 is above the top of the insulator layer 204, to protect that layer during additional downstream processing. The oxide recess can be HF containing wet process or any other oxide etch process selective to silicon such as COR (chemical oxide removal) process. In a COR process, hexafluorossilicate is formed at oxide surface under HF and NH3 gas mixture and evaporated resulting in oxide removal.

FIG. 2C shows semiconductor structure 200 after a subsequent process step of forming an upper portion of the conductor. First, the sacrificial layer 232 is selectively removed. In embodiments, the sacrificial layer 232 is removed using a sulfuric acid solution or any adequate solution that removes organic material. Then, polysilicon is deposited and recessed to form upper portion of the conductor region 218. Imaginary line 219 denotes the boundary between the lower portion of the conductor region 212 and the upper portion of the conductor region 218. From this point forward, the process proceeds as shown in FIG. 1F to continue the fabrication.

FIG. 3A shows a semiconductor structure 300 after formation of an upper portion of the conductor in accordance with another alternative embodiment. FIG. 3A follows from FIG. 1B. In this embodiment, the upper portion of the conductor region 318 is deposited on the lower portion of the conductor region 312 before the spacers 316 are recessed to expose SOI layer 306. Imaginary line 319 denotes the boundary between the lower portion of the conductor region 312 and the upper portion of the conductor region 318. This sequence is in contrast to the embodiment shown in FIG. 1D, where the upper portion of the conductor region is deposited after the spacers are recessed to expose the SOI layer. In this embodiment, the spacers 316 are protected by the upper portion of the conductor region 318. This eliminates the need for the photoresist/OPL shown in the embodiment of FIG. 2B. However, additional polysilicon deposition steps are used in this embodiment to complete the connection of the capacitor to the SOI layer.

FIG. 3B shows semiconductor structure 300 after a subsequent process step of spacer recess. As can be seen in FIG. 3B, the spacer 316 (conformal oxide layer) is recessed to a level below a top 313 of the upper portion of the conductor region 318, and below the top level of the SOI layer 306, such that most of the SOI layer 306 is exposed on the sidewalls of the cavity. However, the top level of the spacer 316 is above the top of the insulator layer 304, to protect that layer from additional downstream processing. As a result of the spacer recess, voids (shown generally as reference 342) are formed between the upper portion of the conductor region 318 and the SOI layer 306. These voids are filled with an additional layer of polysilicon to complete the electrical connection, as described in the next figure.

FIG. 3C shows semiconductor structure 300 after a subsequent process step of polysilicon deposition. A conformal polysilicon film 334 is deposited on the structure, filling voids 342 (see FIG. 3B). In embodiments, film 334 is deposited using a chemical vapor deposition (CVD) process. Dopants can be added during the deposition process to improve conductance between SOI 306 and the upper portion of the conductor region 318. AsH3 gas may be used as a doping gas for As doping.

FIG. 3D shows semiconductor structure 300 after a subsequent process step of polysilicon recess. Most of the conformal polysilicon film 334 (see FIG. 3C) is removed, but a portion of polysilicon film 334 remains and fills the voids 342 (see FIG. 3B). The remaining portion of the conformal polysilicon film is indicated as divot fill regions 336. From this point forward, the process proceeds as shown in FIG. 1F to complete the fabrication.

FIG. 4A shows a semiconductor structure 400 after spacer formation in accordance with another alternative embodiment. FIG. 4A follows from FIG. 1A. In this embodiment, a conformal nitride liner 436 is deposited prior to forming the oxide spacers 416, and is disposed against the insulator layer 404. In embodiments, liner 436 is comprised of silicon nitride.

FIG. 4B shows semiconductor structure 400 after formation of an upper portion of the conductor. The upper portion of the conductor region 418 is deposited on the lower portion of the conductor region 412. Imaginary line 419 denotes the boundary between the lower portion of the conductor region 412 and the upper portion of the conductor region 418.

FIG. 4C shows semiconductor structure 400 after performing a spacer recess. In embodiments, the spacer recess is performed using an isotropic etch process. In some embodiments, the etch process may include a hydrofluoric (HF) etch process. As can be seen in FIG. 4C, the spacer 416 (conformal oxide layer) is recessed to a level below a top 413 of the upper portion of the conductor region 418, and below the top level of the SOI layer 406, such that most of the SOI layer 406 is exposed on the sidewalls of the cavity. However, the top level of the spacer 416 is above the top of the insulator layer 404, to protect that layer during additional downstream processing.

FIG. 4D shows semiconductor structure 400 after performing a liner recess. In embodiments, the liner 436 is recessed using a wet etch technique such as a hot phosphorous etch process. The liner 436 is recessed to about the same level as spacer 416. As a result of the liner recess, voids (shown generally as reference 442) are formed between the upper portion of the conductor region 418 and the SOI layer 406.

FIG. 4E shows semiconductor structure 400 after performing a metal deposition. In contrast to the embodiment of FIG. 3D, where voids are filled with polysilicon, in this embodiment, a metal layer 446 is deposited over the structure, filling voids 442 (see FIG. 4D). In embodiments, the metal layer 446 is comprised of tungsten. In other embodiments, metal layer 446 is comprised of titanium. In embodiments, metal layer 446 may have a thickness ranging from about 5 nanometers to about 10 nanometers, and may be deposited using a CVD process. In other embodiments, an atomic layer deposition (ALD) process may be used to deposit metal layer 446.

FIG. 4F shows semiconductor structure 400 after silicide formation. A metal silicide is formed by performing an anneal. In embodiments, the anneal is performed at a process temperature ranging from about 700 degrees Celsius to about 800 degrees Celsius for a duration ranging from about 30 minutes to about 60 minutes. This causes a silicide to form in areas of metal layer 446 that are exposed to silicon. In the case where metal layer 446 is comprised of tungsten, silicide region 448 is comprised of tungsten silicide. In the case where metal layer 446 is comprised of titanium, silicide region 448 is comprised of titanium silicide. The portions of metal layer 446 that are in contact with pad nitride layer 408 are unreacted and thus do not become metal silicide, and can therefore be selectively removed. In embodiments, the selective removal of unreacted metal is performed using a wet etch with aqua regia (nitric acid hydrochloride).

FIG. 4G shows a side view along line A-A' of FIG. 1E after a subsequent process step of forming TTFS 420 on SOI layer 406 and upper portion of the conductor region 418. As can be seen in FIG. 4G, the TTFS 420 is in direct physical contact with silicide region 448, which in turn, is in contact with SOI layer 406. A section of the upper portion of the conductor region 418 is removed, and the SOI layer 406 is also removed from the area indicated by region 431 during the TTFS formation process.

FIG. 4H shows a side view along line A-A' of FIG. 1E after a subsequent process step of depositing a conformal oxide layer 422 and selective removal of portions of the oxide layer by lithography where not desired. The conformal oxide layer 422 serves to insulate a portion of the capacitor from other devices and/or electrical wiring.

FIG. 4i is a top-down view of the semiconductor structure of FIG. 4H. As can be seen in FIG. 4i, the lower portion of the conductor region 412 has a diameter D1, and the upper portion of the conductor region 418 has a diameter D2, where D2<D1. In embodiments, the second diameter D2 is about 10 percent to about 30 percent smaller than the first diameter D1. As seen in this view, spacer 416 is annular, and defines the diameter D2 of the upper portion of the conductor region 418. Nitride liner 436 is also annular, and surrounds the outer surface of annular spacer 416. This is similar to as described for FIG. 1H. However, in the embodiment of FIG. 4i, silicide region 448 is in contact with the SOI layer 406, in contrast to the embodiment of FIG. 1H, where no silicide region is present. The silicide region provides for reduced resistance, leading to improved device performance.

FIG. 5A shows a semiconductor structure 500 after a process step of deposition an alternative spacer stack in accordance with an alternative embodiment. FIG. 5A follows from FIG. 1A. A silicon oxide spacer 516 is deposited. In embodiments, atomic layer deposition (ALD) is used to deposit the oxide. In embodiments, the oxide thickness may range from about 10 nanometers to about 20 nanometers. Then, a polysilicon liner 523 is deposited on the interior wall of the oxide spacer 516. In embodiments, the polysilicon liner 523 has a thickness ranging from about 5 nanometers to about 10 nanometers. The polysilicon liner serves to protect the oxide spacer 516 from downstream processes, such as wet etching, which can damage the oxide.

Following deposition of the polysilicon, an etch process is used to remove excess polysilicon, such that only the portion on the oxide spacers remains. In embodiments, a dry etch process is used to remove the excess polysilicon. The dry etch process may include first etching polysilicon selective to silicon oxide using BHr and oxygen plasma, followed by a second etch for oxide at the base of the cavity 517 and on top of the pad layer 508. In embodiments, the polysilicon liner 523 may be a doped polysilicon liner, such that it can contribute to the trench conductor. In embodiments, the dopants for the polysilicon liner 523 may include arsenic dopants. In embodiments, the dopant concentration for the polysilicon liner 523 ranges from about 9E15 to about 5E20 atoms per cubic centimeter. The doping may be performed using a low-pressure chemical vapor deposition (LPCVD) process. In embodiments, the doping may be performed at a temperature ranging from about 500 degrees Celsius to about 600 degrees Celsius using a silane (SiH4) precursor with AsH3 as the doping gas in the range of 10-200 mTorr.

FIG. 5B shows semiconductor structure 500 after a subsequent process step of spacer recess, selective to the polysilicon liner. This etch may be isotropic. In embodiments, a wet etch is used to reduce the size of the spacer 516. In embodiments, the spacer recess may be performed using a chemical oxide removal (COR) process. In some embodiments, an uDHF process, utilizing a dilution ratio of about 500:1 (H2O:HF) can be used for improved etching. uDHF exhibits reduced selectivity to oxide material, and especially to nitride. A purpose of polysilicon liner 523 (FIG. 5A) is to protect sidewall of oxide spacer 516 while SOI sidewall is exposed. The interfacial contact region 519 (FIG. 5C) is enlarged while sidewall of spacer 516 is protected for improved contact between lower poly 512 and upper portion of the conductor region 518.

FIG. 5C shows semiconductor structure 500 after a subsequent process step of forming an upper portion of the conductor. Additional polysilicon is deposited and recessed to form upper portion of the conductor region 518. Imaginary line 519 denotes the boundary (interfacial contact region) between the lower portion of the conductor region 512 and the upper portion of the conductor region 518. From this point forward, the process proceeds as shown in FIG. 1F to continue the fabrication.

FIG. 6 is a top-down view of two trench capacitors (603A and 603B) disposed within substrate 202. As can be seen in this view, the separation between lower portion of the conductor region 612A and lower portion of the conductor region 612B is X2, and the separation between upper portion of the conductor region 618A and upper portion of the conductor region 618B is X2, where X2 is greater than X1. Hence, with embodiments of the present invention, there is greater separation between the tops of the trench capacitors, which reduces the chance of shorting, and therefore improves product yield for a given circuit density. Without the embodiments of the present invention, the distance between the capacitors is X1, which increases the chance of a killer defect such as a short.

FIG. 7 shows a flowchart 700 for embodiments of the present invention. In process step 750, a cavity is formed in the structure. In process step 752, a lower conductor region is formed (see 112 of FIG. 1A). In process step 754, an oxide spacer is formed (see 116 of FIG. 1B). In process step 756, the SOI is exposed on the sidewall of the cavity (see 106 of FIG. 1C). In process step 758, an upper conductor region is formed (see 118 of FIG. 1D). In process step 760, trench top fin section is formed (see 120 of FIG. 1E).

FIG. 8 shows a flowchart 800 for alternative embodiments of the present invention utilizing a sacrificial layer. In process step 850, a cavity is formed in the structure. In process step 852, a lower conductor region is formed (see 112 of FIG. 1A). In process step 854, an oxide spacer is formed (see 216 of FIG. 2A). In process step 855, a sacrificial layer is deposited within the spacer (see 232 of FIG. 2A). In process step 856, the SOI layer is exposed on the sidewall of the cavity (see 206 of FIG. 2B). The SOI layer may be exposed by recessing the spacer 216. In process step 857, the sacrificial layer is removed. In process step 858, an upper conductor region is formed (see 218 of FIG. 2C). In process step 860, the trench top fin section is formed (see 120 of FIG. 1H).

FIG. 9 shows a flowchart 900 for alternative embodiments of the present invention utilizing a blanket polysilicon layer. In process step 950, a cavity is formed in the structure. In process step 952, a lower conductor region is formed (see 112 of FIG. 1A). In process step 954, an oxide spacer is formed (see 116 of FIG. 1B). In process step 956, an upper conductor region is formed (see 318 of FIG. 3A). In process step 958, the SOI layer is exposed on the sidewall of the cavity (see 306 of FIG. 3B). In process step 960, a conformal polysilicon film is deposited (see 334 of FIG. 3C). In process step 962, the conformal polysilicon film is recessed to form divot fill regions (see 336 of FIG. 3D). In process step 964, the trench top fin section is formed (see 120 of FIG. 1H).

FIG. 10 shows a flowchart 1000 for alternative embodiments of the present invention utilizing a silicide region. In process step 1050, a cavity is formed in the structure. In process step 1052, a lower conductor region is formed (see 112 of FIG. 1A). In process step 1054, a nitride liner is formed (see 436 of FIG. 4A). In embodiments, nitride liner 436 is comprised of silicon nitride. In process step 1056, an oxide spacer is formed (see 416 of FIG. 4A). In process step 1058, an upper conductor region is formed (see 418 of FIG. 4B). In process step 1060, the spacer is recessed (see 416 of FIG. 4C). In process step 1062, the liner is recessed (see 436 of FIG. 4D). In process step 1064, silicide regions are formed (see 448 of FIG. 4F). In process step 1066, the trench top fin section is formed (see 420 of FIG. 4H). In this embodiment, a silicide region is disposed between the trench top fin section and the SOI layer, providing reduced contact resistance, and thus, better device performance.

FIG. 11 shows a flowchart 1100 for embodiments of the present invention. In process step 1150, a cavity is formed in the structure. In process step 1152, a lower conductor region is formed (see 112 of FIG. 1A). In process step 1154, an oxide spacer is formed. In process step 1155, a polysilicon liner is formed on the interior sidewalls of the spacer (see 523 of FIG. 5A). In process step 1156, the SOI is exposed on the sidewall of the cavity (see 506 of FIG. 5B). In process step 1158, an upper conductor region is formed (see 518 of FIG. 5C). In process step 1160, the trench top fin section is formed.

As can now be appreciated, embodiments of the present invention provide an improved structure and method for deep trench capacitor formation. In embodiments, the trench conductor is shaped into two concentric sections which include a larger diameter lower section and a smaller diameter upper section. An annular spacer defines the diameter of the upper section. A trench top fin section is formed from the upper section, and is electrically connected to a fin of a transistor. The reduced diameter upper portion reduces the risk of shorts to neighboring capacitors, and facilitates an increased circuit density for devices that utilize trench capacitors. In particular, DRAM devices use large numbers of trench capacitors and benefit greatly from the achieved increase in circuit density without adversely affecting product yield and/or device performance.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A method of forming a semiconductor structure, comprising:
    forming a cavity in a semiconductor substrate with a semiconductor-on-insulator region disposed over the semiconductor substrate;
    forming a lower portion of a conductor region in the cavity, the lower portion of the conductor region having an upper surface within the cavity;
    forming an annular spacer within the cavity in contact with the upper surface of the lower portion of the conductor region and covering, at least in part, within the cavity-on-insulator layer of the semiconductor-on-insulator region and exposing, at least in part, within the cavity a semiconductor layer of the semiconductor-on-insulator region over the insulator layer;
    forming an upper portion of the conductor region on the lower portion of the conductor region, in part within the annular spacer, in part in contact with the semiconductor layer of the semiconductor-on-insulator region, and in part above a top surface of the annular spacer; and
    forming a fin portion out of, at least in part, the upper portion of the conductor region, the fin portion of the conductor region being in contact with the semiconductor layer of the semiconductor-on-insulator region over the semiconductor substrate.

2. The method of claim 1, wherein forming an annular spacer comprises:
    depositing a conformal oxide layer;
    recessing the conformal oxide layer to expose the lower portion of the conductor region;
    depositing a sacrificial layer disposed within the conformal oxide layer;
    recessing the conformal oxide layer to a level below a top of the sacrificial layer; and
    removing the sacrificial layer.

3. The method of claim 1, further comprising:
    forming a polysilicon liner on the annular spacer; and
    performing a recess of the annular spacer.

4. The method of claim 3, further comprising doping the polysilicon liner with arsenic.

5. The method of claim 1, further comprising, after forming the upper portion:
    recessing the annular spacer; and
    depositing a polysilicon layer above the annular spacer, wherein the polysilicon layer is in contact with the semiconductor layer of the semiconductor-on-insulator region, and wherein the fin portion is formed, in part, out of the polysilicon layer.

6. A method of forming a semiconductor structure, comprising:
    forming a cavity in a semiconductor substrate with a semiconductor-on-insulator region disposed over the semiconductor substrate;
    forming a lower portion of a conductor region in the cavity;
    forming an annular nitride liner within the cavity and on the lower portion of the conductor region;
    forming an annular spacer within the annular nitride liner and over, in part, the lower portion of the conductor region;
    forming an upper portion of the conductor region on the lower portion of the conductor region, within the annular spacer;
    recessing the annular spacer to a level below a top surface of the upper portion of the conductor region, wherein the recessed the annular spacer covers, at least in part, within the cavity an insulator layer of the semiconductor-on-insulator region;
    recessing the annular nitride liner to expose within the cavity a semiconductor layer of the semiconductor-on-insulator region;
    forming a silicide region on a top portion of the annular spacer, wherein the silicide region is in contact with the semiconductor layer of the semiconductor-on-insulator region disposed over the semiconductor substrate;
    forming a fin portion from, at least in part, the upper portion of the conductor region, wherein the fin portion is in contact with the silicide region.

7. The method of claim 6, wherein recessing the nitride liner comprises performing a hot phosphorous etch.

8. The method of claim 7, wherein forming a silicide region comprises forming a tungsten silicide region.

9. The method of claim 7, wherein forming a silicide region comprises forming a titanium silicide region.

10. The method of claim 8, wherein forming a tungsten silicide region comprises:
    depositing a layer of tungsten; and
    performing an anneal to form the tungsten silicide region.

11. The method of claim 10, wherein performing an anneal comprises performing an anneal at a process temperature ranging from about 900 degrees Celsius to about 1100 degrees Celsius.

12. A semiconductor structure, comprising:
    a semiconductor substrate;
    a semiconductor-on-insulation disposed on the semiconductor substrate, the semiconductor-on-insulator comprising an insulator layer disposed on the semiconductor substrate and a semiconductor layer disposed in the insulator layer;
    a trench formed within the semiconductor substrate;
    a conductor region disposed in the trench, wherein the conductor region comprises a lower portion comprising a first diameter and an upper portion comprising a second diameter, wherein the second diameter is smaller than the first diameter, and a fin portion formed, at least in part, from the upper portion of the conductor region; and an annular spacer region disposed around, in part, the upper portion of the conductor region, wherein a portion of the upper portion of the conductor region extends above a top surface of the annular spacer.

13. The semiconductor structure of claim 12, wherein the conductor region is comprised of polysilicon.

14. The semiconductor structure of claim 12, wherein the second diameter is about 10 percent to about 30 percent smaller than the first diameter.

15. The semiconductor structure of claim 12, wherein the upper portion of the conductor region has a height ranging from about 50 nanometers to about 100 nanometers.

16. The semiconductor structure of claim 12, wherein the fin portion is in contact with the semiconductor layer of the semiconductor-on-insulator.

17. The semiconductor structure of claim 12, wherein the annular spacer region further comprises a nitride liner disposed against the insulator layer.

18. The semiconductor structure of claim 17, further comprising a silicide region disposed between the fin portion and the semiconductor layer of the semiconductor-on-insulator.

19. The semiconductor structure of claim 18, wherein the silicide region comprises tungsten.

20. The semiconductor structure of claim 18, wherein the silicide region comprises titanium.

* * * * *